United States Patent [19]
Yamanobe et al.

[11] Patent Number: 5,576,555
[45] Date of Patent: Nov. 19, 1996

[54] THIN FILM SEMICONDUCTOR DEVICE

[75] Inventors: Masato Yamanobe, Machida; Takayuki Ishii, Hiratsuka, both of Japan

[73] Assignee: Canon Kabushiki Kaisha, Tokyo, Japan

[21] Appl. No.: 451,968

[22] Filed: May 26, 1995

Related U.S. Application Data

[63] Continuation of Ser. No. 96,861, Jul. 27, 1993, abandoned, which is a continuation of Ser. No. 675,333, Mar. 26, 1991, abandoned.

[30] Foreign Application Priority Data

| Mar. 27, 1990 | [JP] | Japan | .................................. 2-78403 |
| Mar. 27, 1990 | [JP] | Japan | .................................. 2-78404 |
| Mar. 27, 1990 | [JP] | Japan | .................................. 2-78406 |

[51] Int. Cl.$^6$ .................................................. H01L 29/04
[52] U.S. Cl. .............................. 257/53; 257/57; 257/59
[58] Field of Search ...................... 357/23.7, 28, 30 I, 357/30 K; 257/53, 59, 60, 61, 72, 57

[56] References Cited

U.S. PATENT DOCUMENTS

| 4,843,265 | 6/1989 | Jiang | 307/310 |
| 5,054,887 | 10/1991 | Kato et al. | 357/23.7 |
| 5,071,779 | 12/1991 | Tanaka et al. | 357/23.7 |
| 5,150,181 | 9/1992 | Takeda et al. | 357/23.7 |
| 5,160,835 | 11/1992 | Yagyu | 257/59 |
| 5,166,816 | 11/1992 | Kaneko et al. | 257/59 |
| 5,202,572 | 4/1993 | Kobayashi | 257/60 |
| 5,308,996 | 5/1994 | Itabashi et al. | 257/53 |

FOREIGN PATENT DOCUMENTS

| 59-061964 | 8/1984 | Japan . |
| 60-101940 | 10/1985 | Japan . |
| 63-009157 | 6/1988 | Japan . |
| 01137674 | 8/1989 | Japan . |

OTHER PUBLICATIONS

T. Wantanabe et al., "Dielectric breakdown of gate insulator due to reactive ion etching," *Solid State Technology*, vol. 27, No. 4, Apr. 1984 pp. 263–266.

P. Sudraud et al., "Focused ion beam repair in microelectronics," *Microelectronic Engineering*, vol. 6, Nos. 1–4, Dec. 1987, pp. 583–595.

W. Heywang, "Amorphe und polykristalline Halbleiter," Springer, Berlin 1984, pp. 64–67.

"Effect of $\alpha$–SiN$_x$:H composition on band being near the interface of $\alpha$–Si:H/$\alpha$–SiN$_x$:H layered structures," K. Hiranaka et al., Journal of Applied Physics, vol. 60, No. 12, Dec. 15, 1986, pp. 4204–4206.

"Influence of an $\alpha$–SiN$_x$:H gate insulator on an amorphous silicon thin–film transistor," K. Hiranaka et al., Journal of Applied Physics, vol. 62, No. 5, Sep. 1, 1987, pp. 2129–2133.

"Step doping in hydrogenated amorphous silicon thin–film transistors for threshold voltage shifts," T. Matsumoto et al., Journal of Applied Physics, vol. 66, No. 10, Nov. 15, 1989, pp. 5058–5062.

"The Physics of Amorphous–Silicon Thin–Film Transistors," M. J. Powell, IEEE Transactions on Electron Devices, vol. 36, No. 12, Dec. 1989, pp. 2753–2763.

"Characteristics of Hydrogenated Amorphous Silicon Thin Film Transistors Fabricated by D. C. Magnetron Sputtering," A. Kolodziej et al., Thin Solid Films, vol. 175, No. 1, Lausanne, CH, pp. 37–42.

*Primary Examiner*—Sara W. Crane
*Assistant Examiner*—Courtney A. Bowers
*Attorney, Agent, or Firm*—Fitzpatrick, Cella, Harper & Scinto

[57] ABSTRACT

A thin film semiconductor device includes a gate electrode, a gate insulating electrode, a thin film semiconductor layer, an ohmic layer, source and drain electrodes, and a protective layer. The protective layer contains an impurity for controlling conductivity.

25 Claims, 26 Drawing Sheets

CENTER 0          EDGE A

CENTER 0          EDGE A

THIN FILM SEMICONDUCTOR DEVICE

This application is a continuation of application Ser. No. 08/096,861 filed Jul. 26, 1993, now abandoned, which, in turn, is a continuation of application Ser. No. 07/675,333 filed Mar. 26, 1991, now abandoned.

BACKGROUND OF THE INVENTION

1. Field of the Invention

The present invention relates to a thin film semiconductor device used in a display, an image scanner, or the like, and to a method of manufacturing the same and, more particularly, to a thin film semiconductor device having uniform electrical characteristics and high reliability upon an increase in chip size in a thin film transistor and a thin film transistor type photosensor.

2. Related Background Art

Along with recent office automation, input/output devices such as a display and an image scanner have received a great deal of attention as man-machine interfaces of OA equipment such as a word-processor, a personal computer, and a facsimile machine. Strong demand has arisen for light-weight, low-profile, low-cost input/output devices.

Judging from these viewpoints, a thin film semiconductor such as hydrogenated amorphous silicon or polysilicon is formed on an insulating substrate having a large area, and an active matrix liquid crystal display using thin film transistors or a photoelectric transducer apparatus using a photosensor have been extensively developed.

FIG. 1A is a sectional view illustrating a structure of a conventional thin film transistor (to be referred to as a TFT hereinafter).

A gate insulating film 2 is deposited on a gate electrode 1, and a thin film semiconductor layer 3 consisting of, e.g., hydrogenated amorphous silicon (to be referred to as a-Si:H) and serving as a channel region is formed on the gate insulating film 2.

$N^+$-type layers 6 are formed between the thin film semiconductor layer 3 and metal electrodes as source and drain electrodes 4 and 5 to serve as ohmic junctions for electrons and blocking junctions for holes. The resultant transistor operates as an n-channel transistor. This transistor structure has a thin film semiconductor surface defining the upper surface of the channel region. FIG. 1B is a plan view illustrating the transistor structure of FIG. 1A. FIG. 1B particularly illustrates a TFT having a planar (the electrodes 4 and 5 in FIG. 1B have an interdigital structure) electrode structure proposed to prevent an increase in channel length and solve the conventional fabrication problems.

The TFT shown in FIGS. 1A and 1B can be applied as a secondary photocurrent type photosensor (e.g., Japanese Laid-Open Patent Application No. 60-101940).

FIGS. 2A and 2B are views for explaining the steps in manufacturing the conventional TFT shown in FIGS. 1A and 1B (the method of manufacturing this TFT is shown in, e.g., Japanese Laid-Open Patent Application No. 63-9157).

A substrate comprises a glass substrate G, and Cr serving as a gate electrode 1 is formed on the glass substrate G. Cr is selectively etched by a photolithographic technique to form the gate electrode 1. A 3,000-Å thick silicon nitride film 2 serving as a gate insulating film, a 5,000-Å thick a-Si:H layer 3 serving as a semiconductor layer, and a 1,500-Å thick $n^+$-type layer 6 are continuously formed on the glass substrate G by, e.g., a plasma CVD method. Aluminum serving as source and drain electrodes 4 and 5 is then deposited by sputtering. A photosensitive resin 8 is applied to the entire surface (FIG. 2A). The resin 8 is patterned into a desired shape upon exposure and development. The aluminum layer serving as the source and drain electrodes is patterned using the resist pattern (FIG. 2B). In this case, the photosensitive resin 8 as a resist pattern is present on the electrodes. The $n^+$-type layer is etched to a depth of 1,800 Å by etching such as RIE (Reactive Ion Etching) using the photosensitive resin as a mask. The photosensitive resin is then removed. Interelement isolation between TFTs is performed to prepare each TFT in FIG. 1A.

After the above process, the surface of a semiconductor thin film of a conventional thin film transistor is susceptible to the influence of an outer atmosphere. When oxygen gas or steam is directly brought into contact with, and adsorbed and diffused in the surface of the semiconductor thin film, electrical characteristics of the semiconductor thin film vary because the semiconductor thin film has a very small thickness. For this reason, it is proposed to cover the element surface with a protective film consisting of silicon nitride ($Si_3N_4$), aluminum oxide ($Al_2O_3$), or silicon oxide ($SiO_2$) (e.g., Japanese Laid-Open Patent Application No. 59-61964).

A method using a polyimide resin film polymerized in a heat treatment as a protective film is also proposed.

In order to further improve stability of the element, a method of stacking a second protective film of the same material as that constituting the thin film semiconductor layer 4 on the polymerized polyimide resin film is also proposed (e.g., Japanese Patent publication No. 1-137674).

A plurality of thin film transistors and photosensors formed on a large substrate by the method described with reference to FIGS. 2A and 2B are required to exhibit uniform characteristics within the large substrate. In the thin film transistor or photosensor formed in the process of FIGS. 2A and 2B, particularly when RIE (Reactive Ion Etching) is used in the step of etching the $n^+$-type layer in FIG. 2B, the surface of the thin film semiconductor layer is damaged by incident ions and the like by RIE, and the electrical characteristics are degraded. In addition, uniformity of the electrical characteristics tends to be lost by a distribution or the like of the RIE incident ions. For example, a threshold voltage which determines the operating characteristics of the thin film transistor varies within the range of several volts on the substrate, and a decisive drawback may be present in an actual application. For example, a display state is greatly changed in an active matrix display. In a sensor, the photocurrent and the dark current as the basic characteristic values greatly vary between elements, and the quality of the read image is greatly degraded, thus posing decisive problems in basic performance.

When a protective film on TFT photosensors having nonuniform characteristics consists of an organic material such as polyimide, stability such as sufficiently high humidity resistance against environmental conditions cannot be expected.

On the other hand, when the protective film consists of an inorganic material (e.g., a-SiN:H) which directly contacts the semiconductor, undesirable electrical characteristics or characteristic distributions are caused in accordance with the formation process of this protective film and the composition of the resultant protective film. For example, Hiranaka et. al. reported the relationship between the composition of the insulating layer and the thin film semiconductor layer 3 as a problem of a TFT gate interface. More specifically, according to Hiranaka et. al., as a problem of the gate interface between the gate insulating film 2 ($SiN_x$:H) and the thin film semiconductor layer 3 (a-Si:H), the gate insulating film composition largely influences a band state of the thin film semiconductor layer 3 (J. Appl. Phys. 62(5), from P. 2129 (1987) and J. Appl. Phys. 60(12), from P. 4294 (1986)). The composition of the insulating layer as a protective film is also assumed to greatly influence humidity resistance.

A fabrication process of a conventional thin film transistor will be described with reference to FIGS. 3A to 3F. A gate electrode 302 is selectively formed on an insulating substrate 301. A gate insulating film 303, a thin film semiconductor layer 304, and an $n^+$-type layer 305 are sequentially deposited on the insulating substrate 301 by the plasm CVD method (FIG. 3A).

An electrode layer 310 serving as source and drain electrodes 306 and 307 is deposited, and a photoresist 308 for patterning the source and drain electrodes 306 and 307 is applied to the electrode layer 310 (FIG. 3B).

The photoresist is patterned into a desired pattern, and the electrode layer 310 is etched by wet etching using the photoresist 308 as a mask, thereby forming the source and drain electrodes 306 and 307 (FIG. 3C).

The $n^+$-type layer 305 is etched using the photoresist 308 as a mask, and the photoresist 308 is removed (FIG. 3D).

After the $n^+$-type layer 305 is patterned to have a desired shape by using the photoresist pattern as a mask, the insulating layer 303, the thin film semiconductor layer 304, the $n^+$-type layer 305, and the electrode layer 310 are etched to perform element isolation (FIG. 3E).

A protective layer 309 is formed on the surface of the thin film semiconductor element by the plasma CVD method to finish the element (FIG. 3F).

The conventional thin film transistor type photosensor is manufactured as described above.

In the thin film transistor and the thin film transistor type photosensor formed by the method described with reference to FIGS. 3A to 3F, when the $n^+$-type layer is etched by reactive ion etching (to be referred to as RIE hereinafter), the surface of the thin film semiconductor layer is damaged by ions incident on the surface of the semiconductor surface. The important electrical characteristics of the thin film transistor type sensor may therefore be greatly degraded. When such an element is formed on a large substrate having a large size, the electrical characteristics of the thin film transistor and the thin film transistor type photosensor have a distribution having a wide range.

In addition, when the surface protective layer of the thin film semiconductor is consists of a silicon nitride film, electrical characteristic degradation such as an increase in dark current in the n-type thin film semiconductor surface may occur. As result, the conventional thin film transistor and the conventional thin film transistor type photosensor cause degradation of display characteristics in a display and degradation of gradation by a low S/N ratio in a sensor in accordance with the degradation of the electrical characteristics and their wide distribution. In this manner, decisive problems associated with basic performance of the element often occur.

SUMMARY OF THE INVENTION

It is an object of the present invention to provide a semiconductor device wherein humidity resistance can be greatly improved, the distribution of electrical characteristics of a thin film transistor in a substrate, and particularly, the dark current, the photocurrent, and their temperature characteristics can be greatly improved, and the temperature distribution of the photocurrent can be greatly improved.

It is another object of the present invention to solve problems in the fabrication process on a large substrate and reliability problems.

It is still another object of the present invention to decrease influences caused by the protective film formation process and the composition of a protective film for assuring high humidity resistance, and to improve the degree of freedom of selection of a protective film.

It is still another object of the present invention to provide a thin film semiconductor device including a gate electrode, a gate insulating layer, a thin film semiconductor layer, an ohmic layer, source and drain electrodes, and a protective layer, wherein an impurity for controlling conductivity is contained in the protective layer.

It is still another object of the present invention to provide a thin film semiconductor device including a source, a drain, and a gate, wherein a channel semiconductor region serves as a light-receiving region, and at least this region is protected with a p-type semiconductor film.

It is still another object of the present invention to provide a thin film semiconductor device including at least a gate electrode, a gate insulating layer, a thin semiconductor layer, an ohmic layer, and source and drain electrodes, wherein a surface layer of the thin film semiconductor device as an upper surface portion of the channel region is depleted with respect to electrons.

It is still another object of the present invention to provide a method of manufacturing a thin film semiconductor device having a surface layer corresponding to an upper surface of a channel region of a transistor, the surface layer being depleted with respect to electrons, wherein reactive ion etching is physically performed to deplete the surface layer corresponding to the upper surface of the channel region with respect to electrons.

It is still another object of the present invention to provide a semiconductor device including a thin film semiconductor device having a gate electrode, a gate insulating layer, a thin film semiconductor layer, an ohmic layer, and source and drain electrodes, and means for applying a voltage for controlling a voltage applied to the gate electrode of the thin film semiconductor device, wherein the surface layer corresponding to an upper surface of the channel region of the thin film semiconductor device is depleted with respect to electrons.

DETAILED DESCRIPTION OF THE PREFERRED EMBODIMENTS

The above objects can be achieved by, briefly speaking, providing a protective layer having an insulating layer or semiconductor layer containing an impurity for controlling conductivity. The impurity for controlling conductivity is selected from elements belonging to Group III of the Periodic Table. More specifically, an p- or n-type impurity is selected.

The above objects can be achieved by, briefly speaking, forming a region depleted with respect to electrons in a surface layer corresponding to the upper surface of the channel region of the transistor after RIE conditions are optimized.

In addition, the above objects can be effectively achieved by correcting temperature characteristics of the photocurrent after a gate voltage of a transistor is controlled.

The present invention will be described in detail with reference to preferred embodiments in conjunction with the accompanying drawings.

(First Embodiment)

Figure 4A:
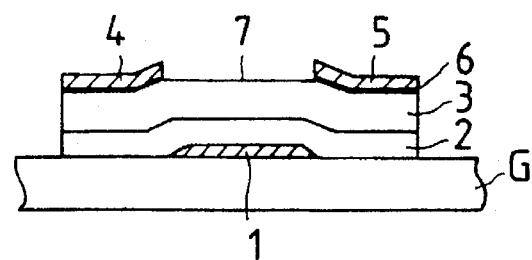
FIGS. 4A and 4B are sectional views of a thin film transistor according to the present invention.

FIG. 4A is an illustrative sectional view for explaining a suitable structure of a thin film transistor (to be referred to as a TFT hereinafter) according to the present invention.

A gate insulating film 2 is deposited on a gate electrode 1, and a thin film semiconductor layer 3 consisting of, e.g., hydrogenated amorphous silicon (to be referred to as a-Si:H) and serving as a channel region is formed on the gate insulating film 2.

Figure 4B:
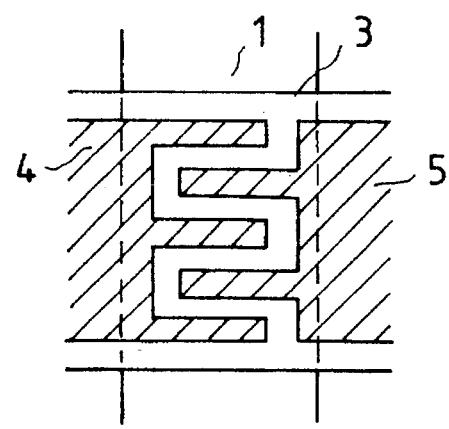

$N^+$-type layers 6 are formed between the thin film semiconductor layer 3 and metal electrodes as source and drain electrodes 4 and 5 to serve as ohmic junctions for electrons and blocking junctions for holes. The resultant transistor operates as an n-channel transistor. This transistor structure has a thin film semiconductor surface defining the upper surface of the channel region. FIG. 4B is a plan view illustrating the transistor structure of FIG. 4A. FIG. 4B particularly illustrates a TFT having a planar (the electrodes 4 and 5 in FIG. 4B have an interdigital structure) electrode structure proposed to prevent an increase in channel length and solve the conventional fabrication problems. In this embodiment, a thin semiconductor surface 7 corresponding to the upper surface of the channel region is depleted with respect to electrons.

FIG. 5 shows a method of manufacturing the thin film semiconductor transistor of the present invention shown in FIG. 4.

Figure 5A:
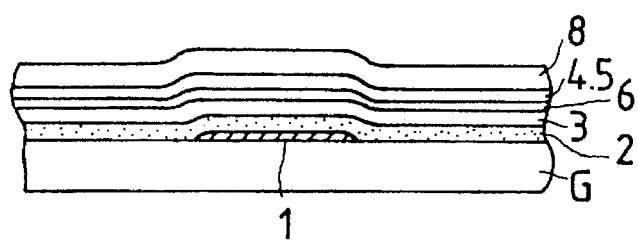
FIGS. 5A and 5B are views for explaining a method of manufacturing the thin film transistor of the present invention.
Figure 5B:
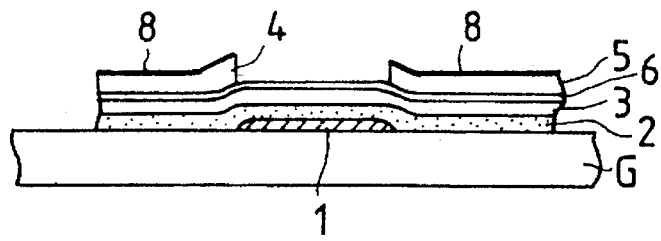

A substrate comprises a glass substrate G, and Cr serving as a gate electrode 1 is formed on the glass substrate G. Cr is selectively etched by a photolithographic technique to form the gate electrode 1. A 3,000-Å thick silicon nitride film 2 serving as a gate insulating film, a 5,000-Å thick a-Si:H layer 3 serving as a semiconductor layer, and a 1,500-Å thick $n^+$-type layer 6 are continuously formed on the glass substrate G by, e.g., a plasma CVD method. Aluminum serving as the source and drain electrodes 4 and 5 is then deposited by sputtering. A photosensitive resin 8 is applied to the entire surface (FIG. 5A). The resin 8 is patterned into a desired shape upon exposure and development. The aluminum layer serving as the source and drain electrodes is patterned using the resist pattern (FIG. 5B). In this case, the photosensitive resin 8 as a resist pattern is present on the electrodes. The $n^+$-type layer is etched to a depth of 1,800 Å by etching such as RIE (Reactive Ion Etching) using the photosensitive resin as a mask. The photosensitive resin is then removed. Interelement isolation between TFTs is performed to prepare each TFT in FIG. 4A.

Figure 1A:
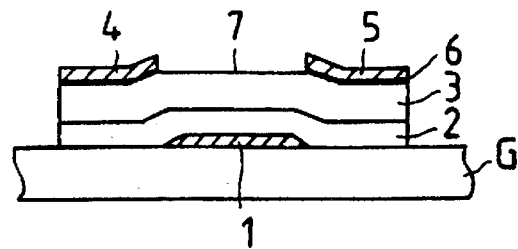
FIGS. 1A and 1B are sectional views of a conventional thin film transistor.
Figure 1B:
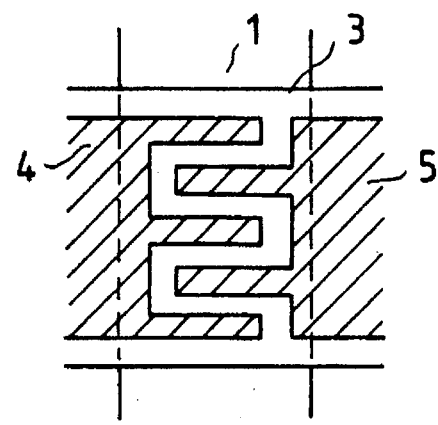
Figure 2A:
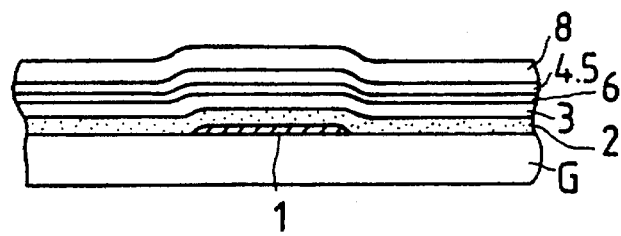
FIGS. 2A and 2B and FIGS. 3A to 3F are views for explaining the steps in manufacturing the conventional thin film transistors.
Figure 2B:
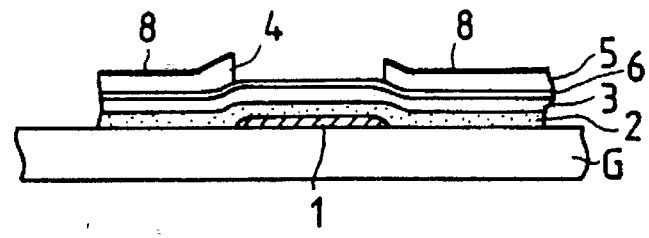
Figure 3A:
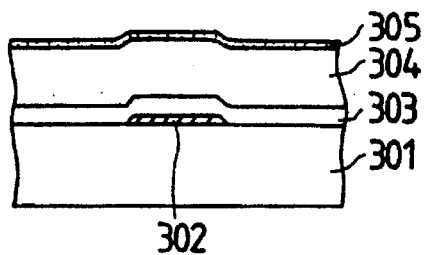
Figure 3D:
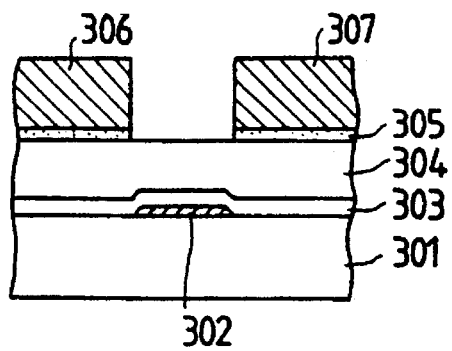
Figure 3B:
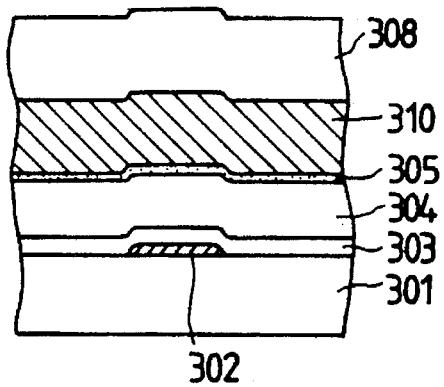
Figure 3E:
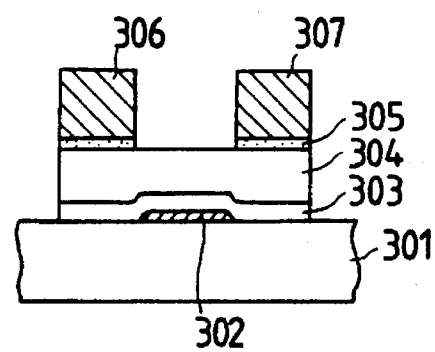
Figure 3C:
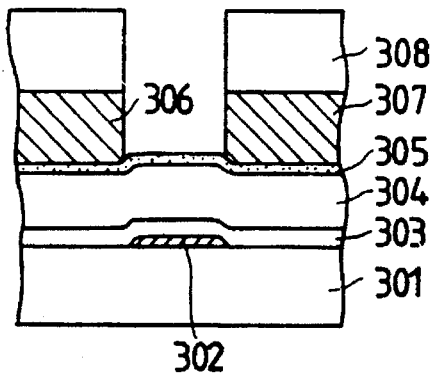
Figure 3F:
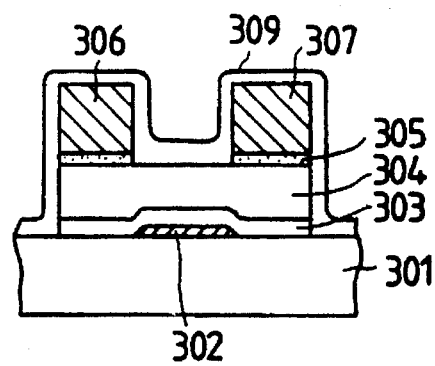

The method of manufacturing the thin film transistor and the photosensor according to the present invention is almost the same as the conventional method described in FIGS. 2A and 2B. The thickness of the respective layers and films may be the same as those of the conventional example in FIGS. 2A and 2B.

RIE conditions for etching the $n^+$-type layer in FIG. 4B are different from those in the conventional method as follows.

Figure 6:
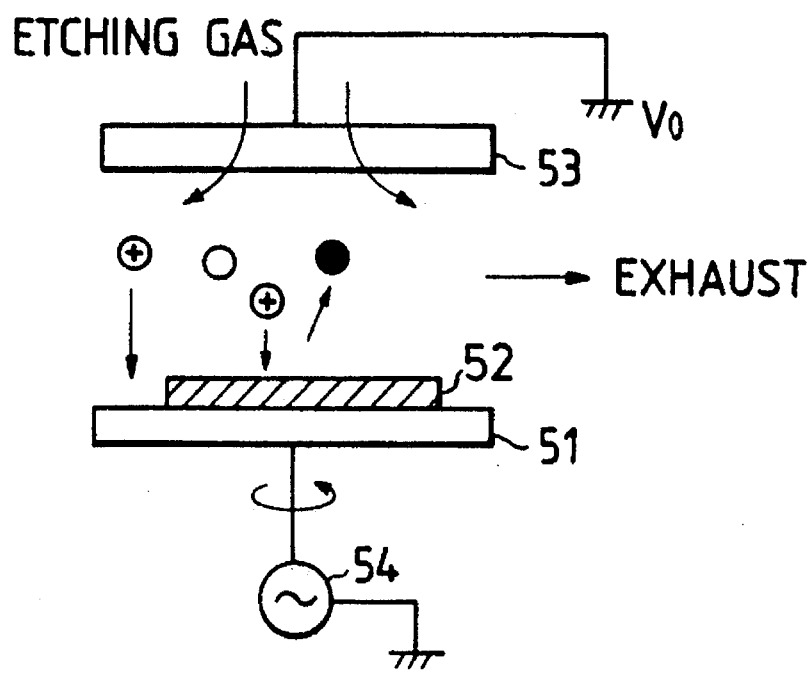
FIG. 6 is a view showing the principle of an RIE apparatus.

FIG. 6 is a schematic view of a general RIE apparatus and shows an etching mechanism.

This apparatus includes a cathode 51, and an anode 53. A sample substrate 52 is placed on the cathode 51 and opposes the anode 53 to be spaced apart therefrom. An RF power source 54 is connected to the cathode 51. Active ions $\oplus$ are directed from the anode 53 to the cathode 51. Neutral gas molecules (e.g., radicals) are represented by hollow circles, and reacted molecules are represented by black dots.

When an etching gas such as $CF_4$ is supplied from an anode electrode 53 side and an RF power is supplied from the RF power source 54 to the cathode electrode 51, active ions $\oplus CF_3^+$ and radicals oF* are generated by the etching gas. The active gas ions $\oplus$ are incident on the sample surface, and reactive etching is performed. When the sample substrate 52 consists of Si, Si becomes a reacted molecule $\odot SF_4$, and etching progresses. An incident energy of the active ions $\oplus$ is controlled by the gas pressure and the input power. More specifically, when the pressure is reduced and the input power is increased, physical etching having a high ion incident energy is performed. However, when the pressure is increased and the input power is decreased, chemical etching having a low ion incident energy is performed (Reference: Sadao Sugano, Semiconductor Plasma Process Technique, from P. 153, Sangyo Tosho (1980)).

The thin film semiconductor layer 3 in the thin film transistor or the secondary photocurrent type TFT photosensor in FIG. 4 is exemplified to consist of hydrogenated amorphous silicon.

Figure 7:
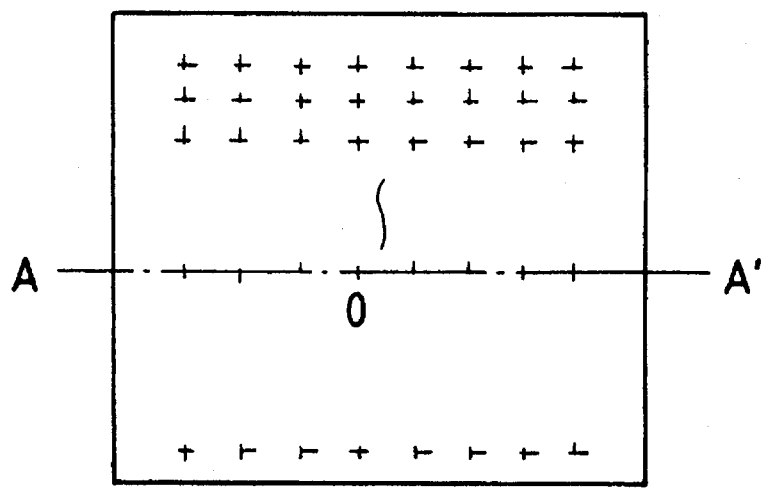
FIG. 7 is a view showing a glass substrate having a large area used in the present invention.

$N^+$-type layers to be deposited on large glass substrates (FIG. 7) having a size of 300 mm☐ to form thin film transistors at a pitch of about 20 mm were formed under three RIE conditions from the physical etching condition to the chemical etching condition. Referring to FIG. 7, the line A—A' represents the center line of the substrate, and 0 is the center of the substrate. The RIE conditions are shown below.

| Condition | ① | ② | ③ |
| --- | --- | --- | --- |
| RF Power (W) | 500 | 250 | 250 |
| Pressure (pa) | 3 | 10 | 30 |
| Etching Gas | $CF_4$ | ← | ← |
| Flow Rate | 20 SCCM | | |

In the above table, condition ① is the physical etching condition, condition ③ is the chemical etching condition, and condition ② is an intermediate condition between conditions ① and ②.

The electrical characteristics of the thin film transistor and the photosensor are represented by dark currents Id, threshold voltages $V_{th}$ of dark currents, mobility μ, photocurrents $I_p$, and temperature characteristics of the dark currents and photocurrents.

Figure 8A:
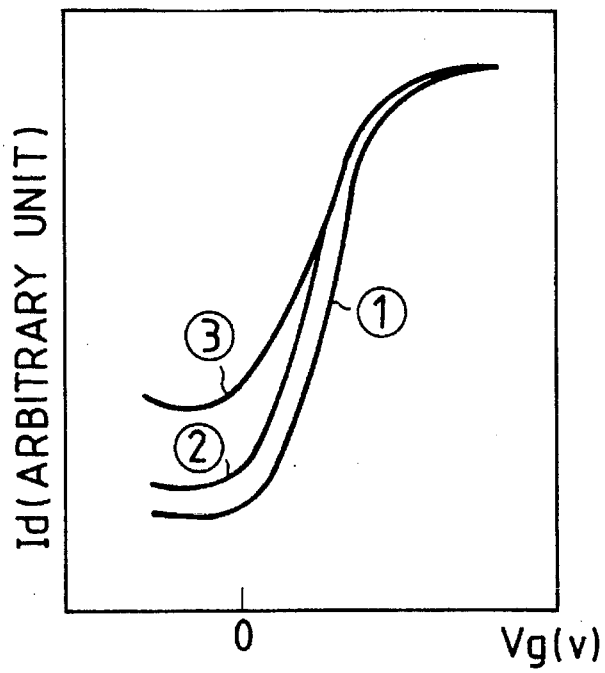
FIG. 8A is a graph showing dark currents of thin film transistor type photosensors formed in RIE conditions 1, 2, and 3 as a function of the gate voltage.
Figure 8B:
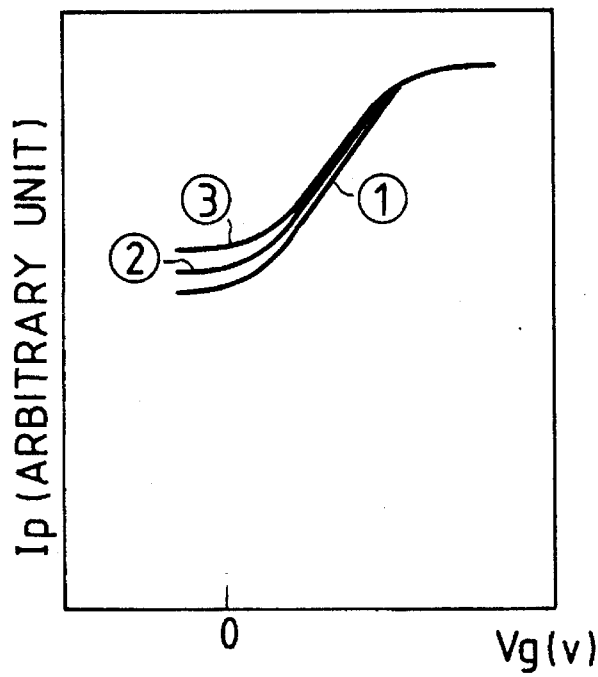
FIG. 8B is a graph showing photocurrents of the thin film transistor type photosensors formed in the RIE conditions 1, 2, and 3 as a function of the gate voltage.

FIG. 8A shows dark current dependency on gate bias voltage Vg at room temperature under RIE conditions ①, ②, and ③. FIG. 8B shows photocurrent dependency on the gate bias voltage Vg of the thin film transistor type photosensor formed at the center 0 of the large substrate of FIG. 7 at room temperature. Note that the drain bias voltage Vd was set to be 10 V. As is apparent from FIGS. 8A and 8B, the electrical characteristics are greatly changed in accordance with changes in RIE etching conditions of the $n^+$-type layers. Under condition ③, the dark current Id becomes large on the OFF side. When the sample was used as a TFT photosensor, the S/N ratio was confirmed to be undesirably reduced.

In order to clarify the distribution of the thin film transistor type photosensor on the line A—A' of the large substrate in FIG. 7, electrical characteristics depending on the RIE conditions at operating points Vg=0 and Vg=10 V have been described above.

Figure 9:
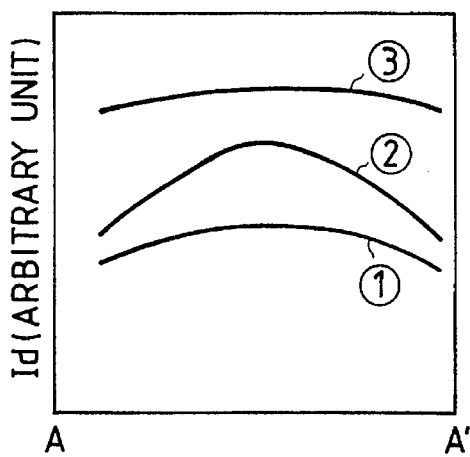
FIGS. 9 is a graph showing an on-chip dark current distribution of the thin film transistor type photosensors formed in the RIE conditions 1, 2, and 3.

FIG. 9 shows an A—A' distribution of dark currents Id. As is apparent from FIG. 9, the magnitudes of the dark currents Id in conditions ①, ②, and ③ are given as follows:

③>②>① and the degree of nonuniformity (distribution) of the dark currents Id was maximum in condition ②.

Figure 10:
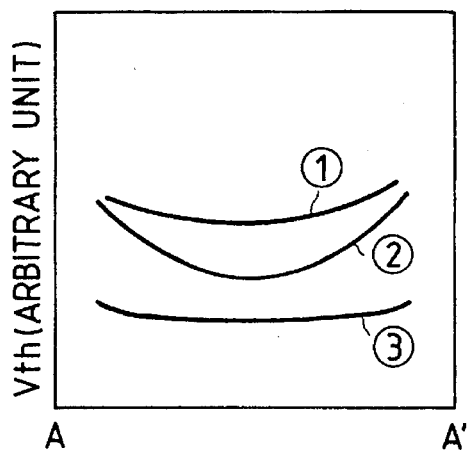
FIG. 10 is a graph showing an on-chip threshold voltage distribution of the thin film transistor type photosensors formed in the RIE conditions 1, 2, and 3.

FIG. 10 shows an A—A' distribution of the threshold voltages $V_{th}$.

As is apparent from FIG. 10, the magnitudes of the threshold voltages $V_{th}$ satisfy the following condition:

①>②>③

The degree of nonuniformity (distribution) of the threshold voltage $V_{th}$ is maximum in condition ② and minimum in condition ③.

Figure 11:
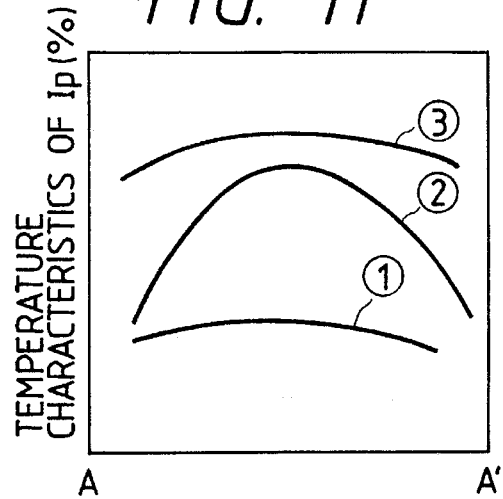
FIG. 11 is a graph showing an on-chip photocurrent temperature characteristic distribution of the thin film transistor type photosensors formed in the RIE conditions 1, 2, and 3.

FIG. 11 shows temperature characteristics of photocurrent $I_p$. In this case, a photocurrent ratio (to be referred to as temperature characteristics of the photocurrent hereinafter) at 25° C. and 55° C. is shown. The temperature characteristics of the photocurrent are represented by the following equation:

$$\text{Temperature Characteristics Of Photocurrent} = \frac{\text{Photocurrent at 25° C.}}{\text{Photocurrent at 55° C.}} \times 100(\%)$$

As is apparent from FIG. 11, the temperature characteristics of the photocurrents $I_p$ satisfy the following condition:

③>②>①

A degree of nonuniformity (distribution) of the temperature characteristics of the photocurrent $I_p$ becomes maximum in condition ②.

Figure 12:
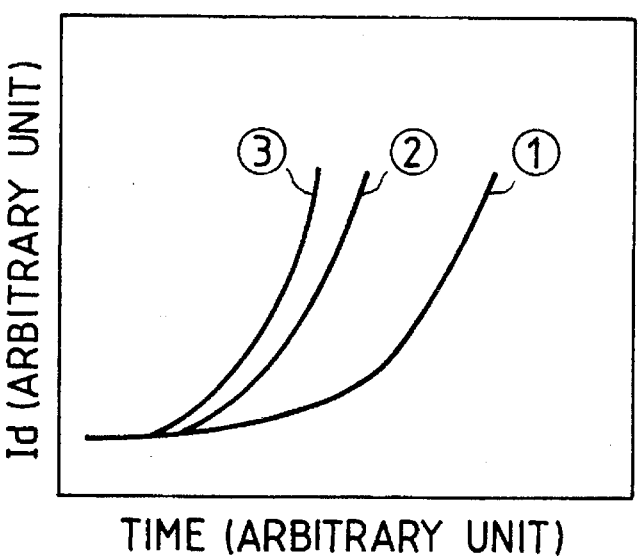
FIG. 12 is a graph showing humidity resistance test results of the thin film transistor type photosensors formed in the RIE conditions 1, 2, and 3.

FIG. 12 shows high-humidity, high-temperature leaving test results of the thin film transistor type photosensor or the thin film transistor formed at the center 0 of the substrate in FIG. 7 at a temperature of 60° C. and a humidity of 90%. In this case, a polyimide resin was used to form a passivation film. The dark currents Id at operating points (Vd=10 V and Vg=0 V) are plotted along the ordinate, and the high-temperature, high-humidity leaving time is plotted along the abscissa.

As is apparent from FIG. 12, the humidity resistances were lowered in an order of conditions ①, ②, and ③.

It is thus apparent from the above description that the electrical characteristics of the thin film transistor and the TFT photosensor greatly depend on the RIE etching conditions of the $n^+$-type layers, and the S/N ratio and the humidity resistance are greatly changed. The following findings are therefore obtained. That is, in physical etching, the dark current is small, the temperature characteristics of the photocurrent are small, the distribution is relatively small, and humidity resistance is relatively good. In chemical etching, the dark current is large, the temperature characteristics of the photocurrent are large, the distribution is relatively small, and the humidity resistance is poor.

According to the present invention, an etching condition of the $n^+$-type layer is set to be the physical etching condition, so that drawbacks such as a small dark current Id, a high humidity resistance, and small temperature characteristics of the photocurrent can be solved. The present invention aims at correcting the above drawbacks by utilizing dependency of the temperature characteristics of the photocurrent on the gate bias voltage.

Figure 13:
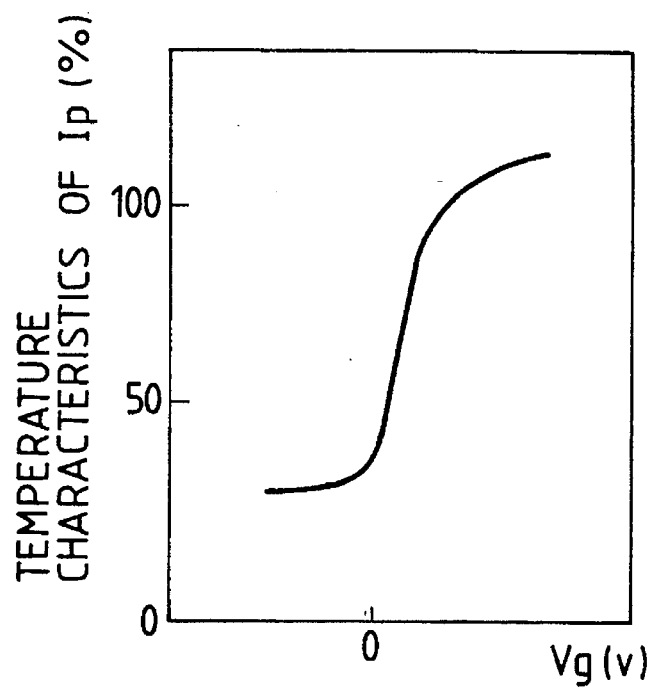
FIG. 13 is a graph showing the temperature characteristics of the photocurrent of a thin film transistor type photosensor as a function of the gate voltage.

FIG. 13 shows dependency of temperature characteristics of the photocurrent on the gate bias voltage in RIE condition ③ of the $n^+$-type layer. The temperature characteristics of the photocurrent Id are increased from the negative side to the positive side of the gate bias voltage Vg. The temperature characteristics exceed 100% and are saturated. The temperature characteristics of the photocurrent can be increased from the range of 30 to 40% to the range of 60 to 70% when the operating point is changed from Vg=0 (Vd=10 V) to the Vg=1 V (Vd=10 V). When the voltage Vg is set to be an extremely large positive value, the dark current Id is increased and the S/N ratio is decreased, as is apparent from FIG. 8A. Therefore, the operating point voltage cannot be set to be an extremely large positive value.

Energy band diagrams according to the present invention are estimated as follows.

Figures 14A, 14B, 14C:
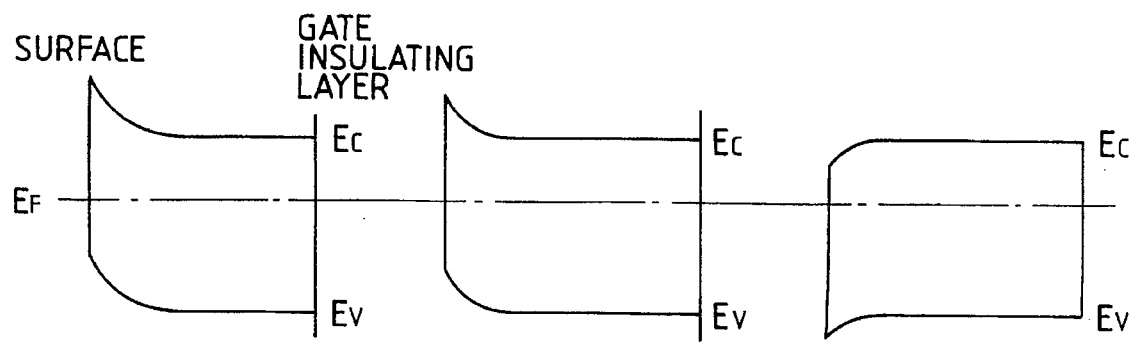
FIGS. 14A, 14B, and 14C are energy band diagrams of the thin film transistor type photosensors formed in assumed RIE conditions 1, 2, and 3.

FIGS. 14A, 14B, and 14C are energy band diagrams of the thin film transistor at the center 0 of the substrate (FIG. 7) under conditions ①, ②, and ③ of $n^+$-type layer etching. For the sake of simplicity, FIGS. 14A, 14B, and 14C are energy band diagrams of sections (in a dark state) of thin film semiconductor layers 3 (FIGS. 4A and 4B) taken from the surfaces 7 thereof to the gate electrodes 1 at the interfaces of the gate insulating films near $V_{th}$ of the thin film transistors, i.e., near the flat bands with small voltages Vd. More specifically, FIG. 14A shows the energy band diagram corresponding to condition ① as the RIE condition. The surface layer is depleted with respect to electrons due to the physical etching condition.

FIG. 14B shows the energy band diagram corresponding to condition ② as the RIE condition. FIG. 14C shows the energy band diagram corresponding to condition ③ as the RIE condition. In this condition, the sample element is set in an electron storage state. Referring to each of FIGS. 14A to 14C, the thickness of each thin film semiconductor layer 3 is large, and the band potential of the surface does not reach the gate interface. However, when the thickness is decreased, the potential at the gate interface is changed. As a result, the characteristics shown in FIGS. 8A to 11 are obtained.

In chemical etching condition ③, a current flows through the surface layer in the state of FIG. 14C, and the sample element is susceptible to influences of an outer atmosphere, and especially, water.

Figure 15:
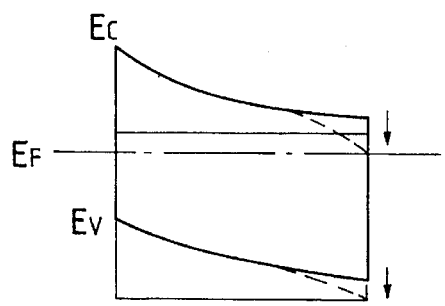
FIG. 15 is an energy band diagram obtained by correcting the energy band with the gate voltage of the assumed thin film transistor type photosensor.

FIG. 15 is an estimated energy band diagram of a thin film transistor type photosensor according to the present invention. Since the surface 7 is etched under RIE condition ③, it is depleted. In addition, depletion of this surface also occurs on the gate insulating side by depletion of the surface 7. As shown in FIG. 10, the threshold voltage $V_{th}$ is shifted to the positive side. Since the surface layer is depleted, the humidity resistance is high. When the voltage is adjusted by about 1 V, i.e, when a condition represented by the broken curve of the energy band diagram in FIG. 15 is given, the temperature characteristics of the photocurrent can be adjusted. In particular, the distribution within the large substrate is derived from the distribution of the incident ion energy, as shown in FIGS. 8A to 11. Therefore, when a degree of correction of the voltage Vg in FIG. 15 is adjusted to coincide with the distribution, uniform electrical characteristics can be obtained.

Since the semiconductor surface etched under the RIE condition becomes an inactive semiconductor, as described above, it is rarely influenced by the composition and formation process of a passivation film in the subsequent step. This effect can be equally applied not only to a TFT photosensor but also to a TFT coplanar photosensor.

(Second Embodiment)

Figure 16:
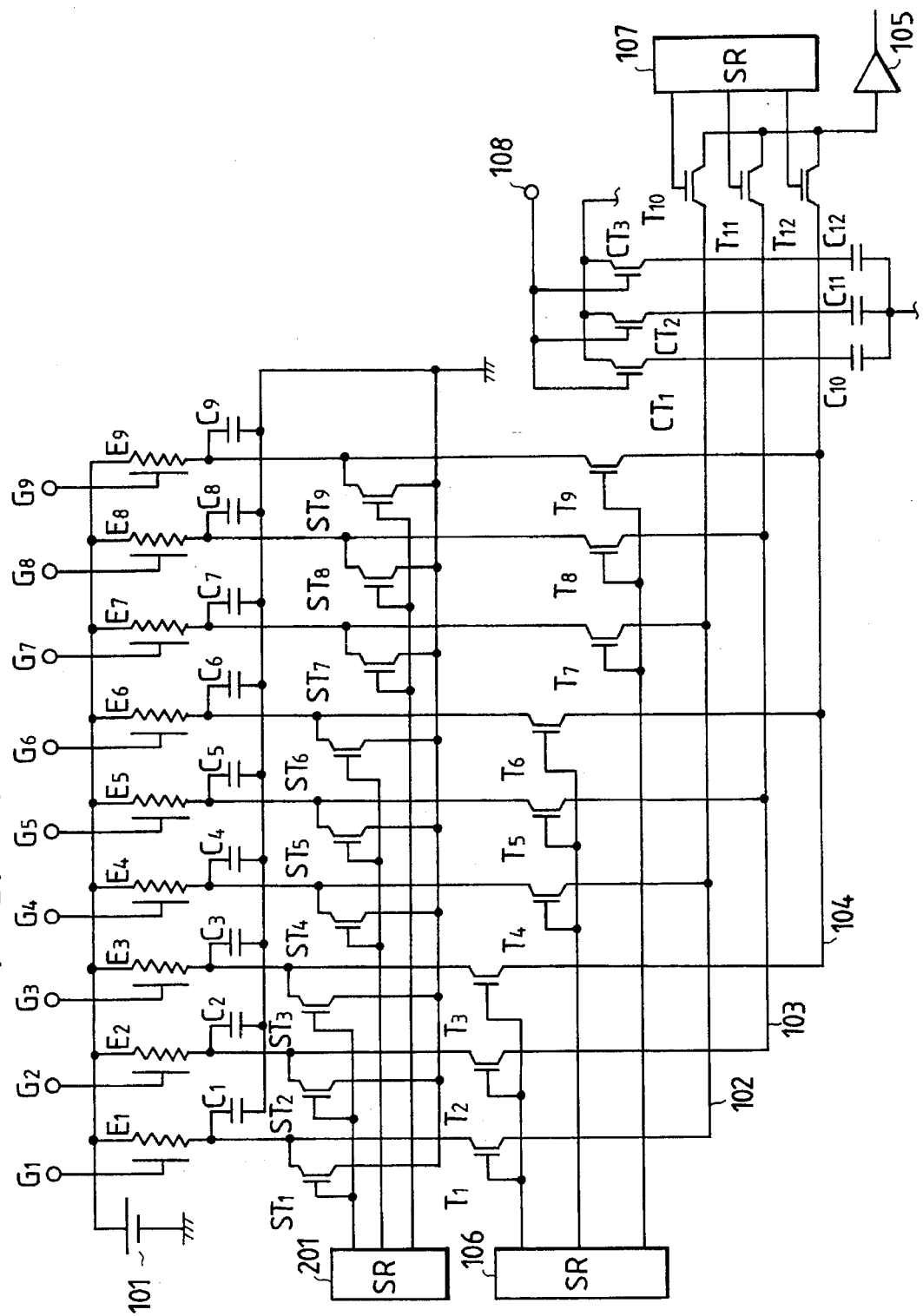
FIG. 16 is a circuit diagram showing a perfect contact sensor circuit.

The second embodiment of the present invention utilizes as a one-dimensional perfect contact sensor array a drive circuit consisting of the photosensors and the thin film transistors manufactured in the process of the first embodiment. FIG. 16 shows an arrangement of a perfect contact sensor constituted by the photosensors and the thin film transistors of the present invention.

In this arrangement, a sensor array has nine photosensors.

Referring to FIG. 16, three out of nine photosensors E1 to E9 constitute each block, and three blocks constitute a photosensor array. This applies to capacitors C1 to C9 and switching transistors T1 to T9 in correspondence with the photosensors E1 to E9. Individual electrodes having identical numbers in the respective blocks constituted by the photosensors E1 to E9 are connected to one of common lines 102 to 104.

More specifically, the first switching transistors T1, T4, and T7 of each block are connected to the common line 102, the second switching transistors T2, T5, and T8 of each block are connected to the common line 103, and the third switching transistors T3, T6, and T9 are connected to the common line 104. The common lines 102 to 104 are connected to an amplifier 105 through switching transistors T10 to T12.

The gate electrodes of switching transistors ST1 to ST9 are commonly connected in units of blocks as in the gate electrodes of the switching transistors T1 to T9 and are connected to parallel output terminals of a shift register 201 in units of blocks. The switching transistors ST1 to ST9 are sequentially turned on in units of blocks in response to shift timing pulses of the shift register 201.

Referring to FIG. 16, the common lines 102 to 104 are formed through capacitors C10 to C12, respectively and are grounded through switching transistors CT1 to CT3.

The capacitance of each of the capacitors C10 to C12 is sufficiently larger than that of each of the capacitors C1 to C9. The gate electrodes of the switching transistors CT1 to CT3 are commonly connected, and the common node is connected to a terminal 108. That is, when the terminal 108 is set at high level, the switching transistors CT1 to CT3 are simultaneously turned on, and the common lines 102 to 104 are grounded.

Each sensor comprises a thin film transistor type photosensor, and gate electrodes G1 to G9 correspond to the sensors E1 to E9, respectively.

Figure 17A:
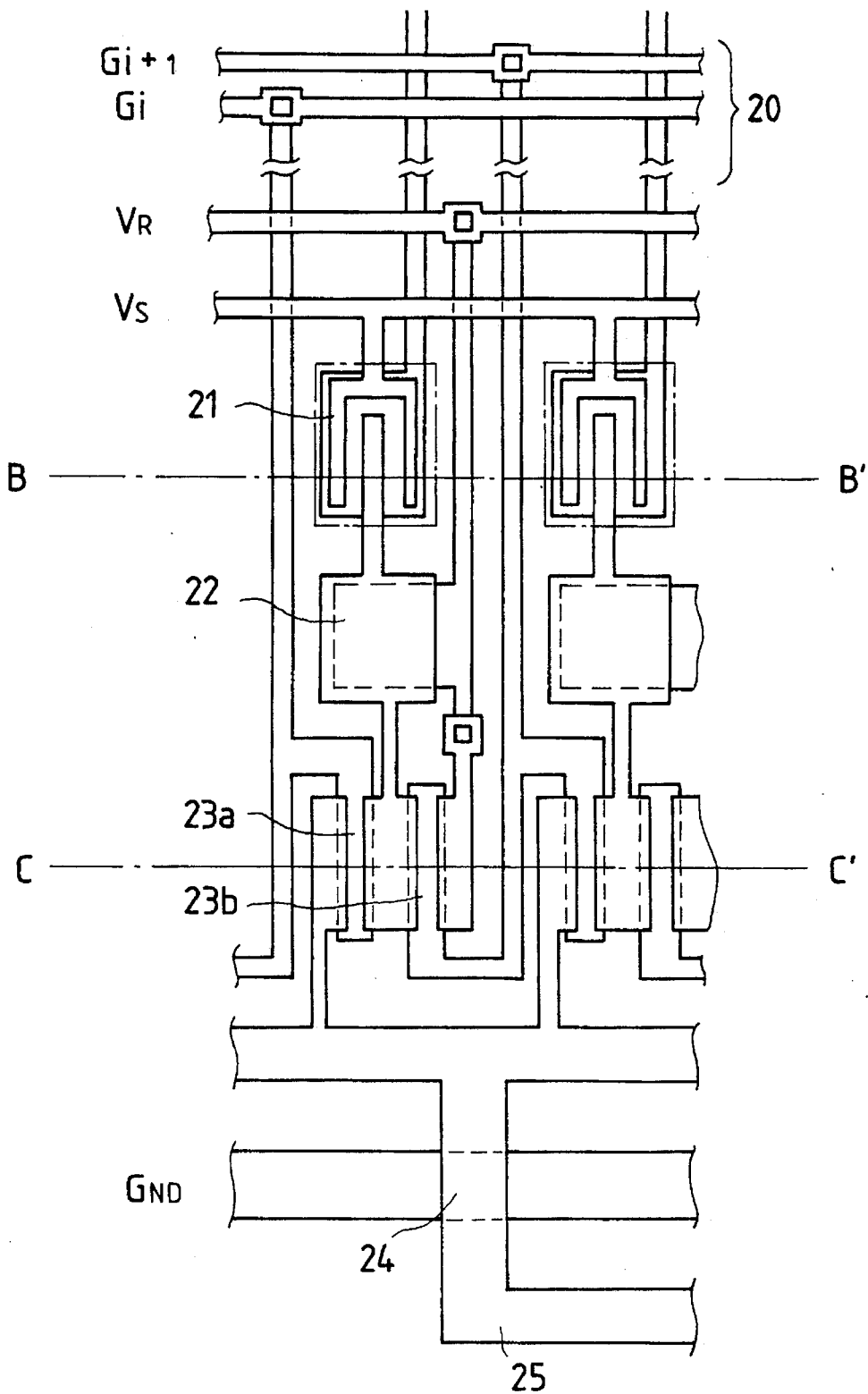
FIG. 17A is a plan view showing part of a perfect contact sensor arranged on the basis of the circuit shown in FIG. 16.

FIG. 17A is a plan view showing part of a perfect contact sensor arranged on the basis of the circuit diagram of FIG. 16.

Referring to FIG. 17A, a wiring unit 20 is formed in a matrix form. A photosensor unit 21 is formed by using a thin film transistor photosensor. A transfer switch 23a is arranged by using a thin film transistor of the present invention. A discharge switch 23b is arranged by utilizing the thin film transistor of the present invention to reset the charge of a charge storage unit 22. A lead line 25 connects a transfer switch signal output to a signal processing IC. A load capacitor 24 stores the charge transferred by the transfer switch 23a and reads out the transferred charge. In this embodiment, an a-Si:H film is used as a photoconductive semiconductor layer constituting the photosensor unit 21, the transfer switch 23a, and the discharge switch 23b. A plasma-CVD silicon nitride film is used as an insulating layer.

Referring to FIG. 17, only upper and lower wiring layers are illustrated for illustrative convenience, and the photoconductive semiconductor layer and the insulating layer are not illustrated. An $n^+$-type layer is formed at the interface between the upper electrode wiring layer and the photoconductive semiconductor layer to achieve an ohmic contact.

Figure 17B:
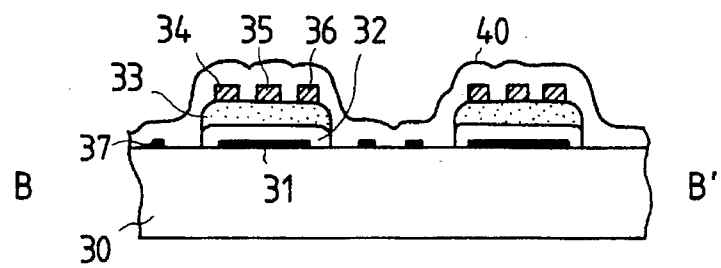
FIGS. 17B and 17C are sectional views of the perfect contact sensor shown in FIG. 16.

FIG. 17B is a longitudinal sectional view of the photosensor unit 21. The photosensor unit 21 comprises a lower electrode wiring layer 31 serving as a gate electrode, an insulating layer 32 serving as a gate insulating layer, a photoconductive semiconductor layer 33, an upper electrode wiring layer 35 serving as a source electrode, an upper electrode wiring layer 34 serving as a drain electrode, and a protective layer 40 consisting of polyimide resin or the like.

Figure 17C:
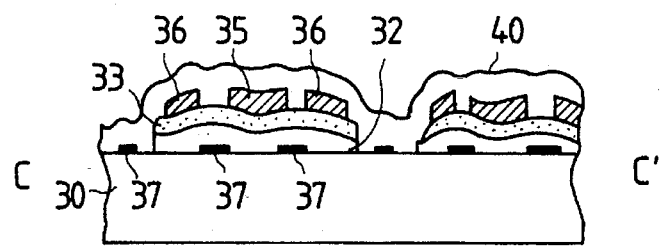

FIG. 17C is a longitudinal sectional view of the transfer switch 23a and the discharge switch 23b. The transfer switch 23a comprises a lower electrode wiring layer 37 serving as a gate electrode, the insulating layer 32 serving as a gate insulating layer, the photoconductive semiconductor layer 33, and the upper electrode wiring layer 35 serving as a source electrode. The gate insulating layer and the photoconductive semiconductor layer of the discharge switch 23b are the same as the insulating layer 32 and the photoconductive semiconductor layer 33. The source electrode consists of the upper electrode wiring layer 35, the gate electrode consists of the lower electrode wiring layer 37, and the drain electrode consists of an upper electrode wiring layer 36. The transfer switch 23a and the discharge switch 23b are covered with the protective layer 40 of a polyimide resin or the like. As described above, an ohmic contact layer is formed between the upper electrode wiring layers 34, 35, and 36 of the photosensor unit, the transfer switch, and the discharge switch and the photoconductive semiconductor layer 33.

According to the present invention, the RIE condition for removing the $n^+$-type layer formed between the source and drain electrodes 35 and 34 is given as physical etching condition ① described with reference to the first embodiment. The surface region of the photoconductive semiconductor layer 33 is depleted, and at the same time dependency of the temperature characteristics of the photocurrent on the voltage of the gate electrode 31, as described with reference to the first embodiment, is utilized to correct the operating point so that the temperature characteristics of the photocurrent fall within the range of 60 to 70%. On the other hand, although the switching transistors T1 to T9 and ST1 to ST9 are formed in the same RIE condition, no practical problem is posed.

Figure 18:
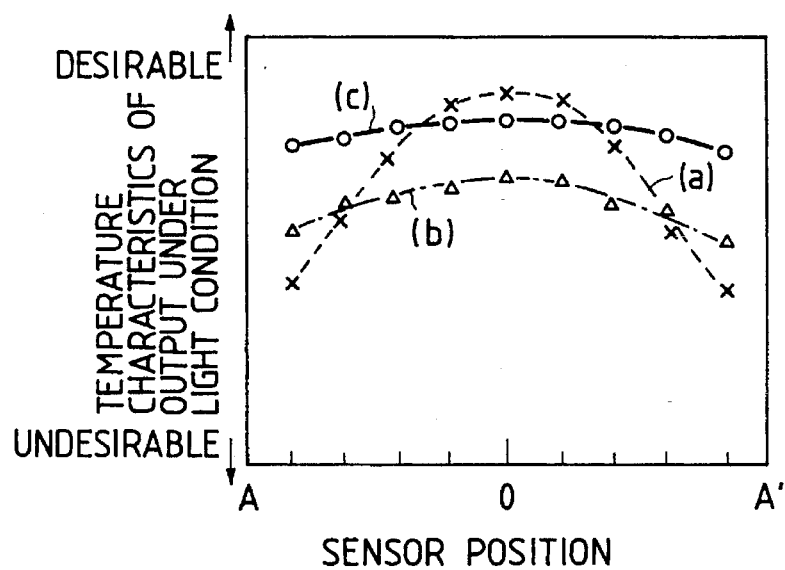
FIG. 18 is a graph showing comparison of the temperature characteristics of outputs under light condition of the perfect contact sensor shown in FIGS. 17A, 17B and 17C.

FIG. 18 shows the distribution of the temperature characteristics of an output under light condition in the one-dimensional perfect contact sensor formed on a large substrate. The one-dimensional perfect contact sensor is formed such that photosensors are aligned on the line A—A' in FIG. 3.

The distributions of the temperature characteristics of outputs under light condition in the one-dimensional contact sensor array (A) using photosensors and thin film transistors of the present invention and a one-dimensional perfect contact sensor array (B) using the conventional photosensors and thin film transistors formed under RIE condition ② of the first embodiment but having no temperature characteristic correction are indicated by a broken curve (a) and an alternate long and short dashed curve (b) in FIG. 18, respectively. The distribution of the photocurrents of the one-dimensional perfect contact sensor array (A) of the present invention is better than that of the conventional one-dimensional perfect contact sensor array (B), but has poor temperature characteristics of the photocurrent.

According to the present invention, gate voltages are respectively applied to the gate electrodes G1 to G9 shown in FIG. 16 to improve the temperature characteristics of the photocurrent, as indicated by a solid curve (c) in FIG. 18. The distribution of the temperature characteristics of the photocurrent and the temperature characteristics themselves are improved, as indicated by the solid curve (c) of FIG. 18.

Figure 19:
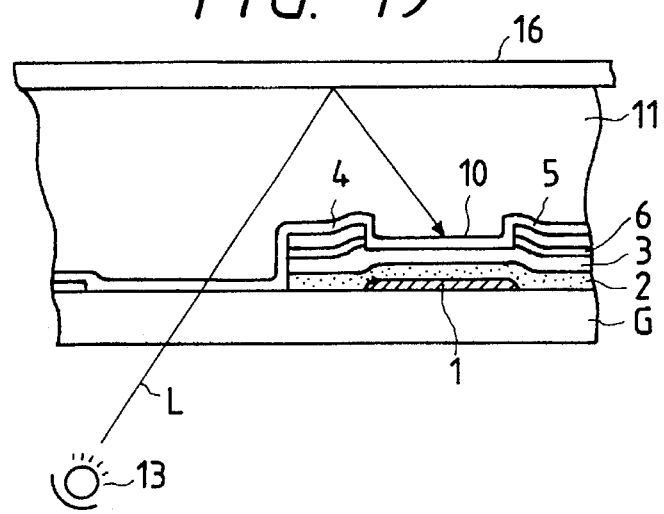
FIG. 19 is a sectional view showing a structure of a lensless perfect contact sensor according to the present invention.

The one-dimensional contact sensor array of the present invention can be used as a lensless perfect contact sensor array for reading an original 16 upon radiation of light from a light source 13 to the lower surface of the sensor after an anti-wear layer 11 is formed on the upper surface of the photosensor, as shown in FIG. 19.

Figure 20:
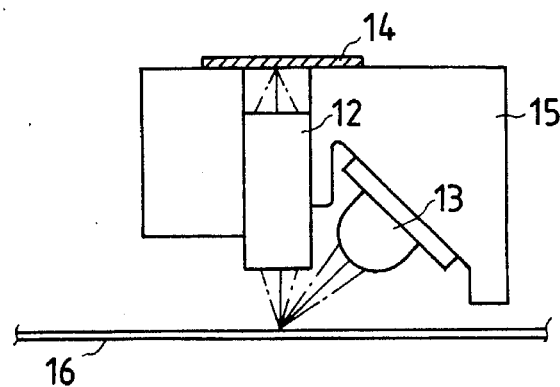
FIG. 20 is a sectional view showing a perfect contact sensor with a lens according to the present invention.

The one-dimensional contact sensor array can also be used as a contact sensor array using a one-to-one size focusing lens (SELFOC lens available from Nippon Sheet Glass Co., Ltd.) 12 shown in FIG. 20.

(Third Embodiment)

Figure 21:
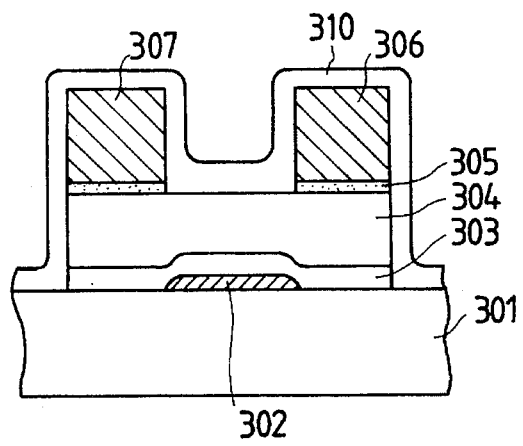
FIG. 21 is a sectional view of a semiconductor device according to the present invention.

FIG. 21 is a sectional view of a thin film transistor type photosensor according to the present invention. FIGS. 22A to 22F are sectional views for explaining the steps in manufacturing the thin film transistor type photosensor shown in FIG. 21.

Figure 22A:
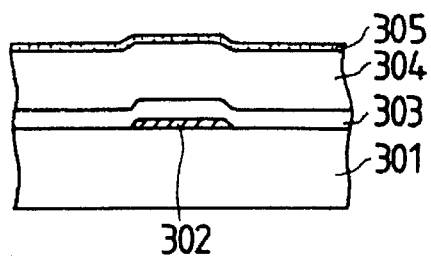
FIGS. 22A to 22F are sectional views for explaining the steps in manufacturing a semiconductor device in a glass substrate having a large area.

Cr for forming a gate electrode 302 is selectively formed on an insulating substrate 301, and a 3,000-Å thick hydrogenated amorphous silicon nitride film (a-SiN$_x$:H; to be referred to as a silicon nitride film) serving as a gate insulating film 303, a 5,000-Å thick hydrogenated amorphous silicon layer (to be referred to as an a-Si:H hereinafter) serving as a thin film semiconductor layer 304, and a 1,500 Å thick n$^+$-type layer 305 are sequentially formed on the insulating substrate 301 by a plasma CVD method, as shown in FIG. 22A).

Figure 22B:
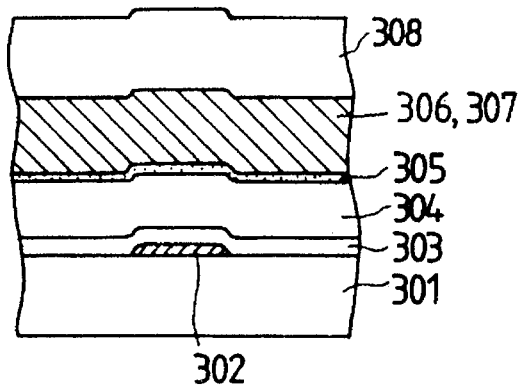

A 1-μm thick aluminum film serving as source and drain electrodes 306 and 307 is deposited by sputtering, and a photoresist 308 for patterning the source and drain electrodes is applied to the surface of the structure (FIG. 22B).

Figure 22C:
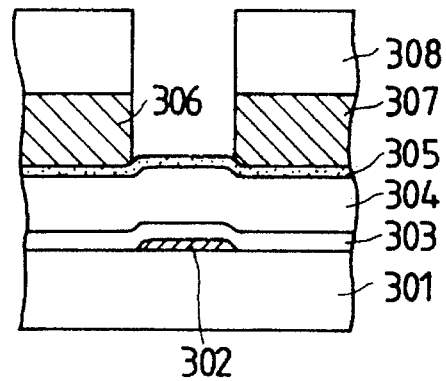

The photoresist 308 is patterned to have a desired shape, and the source and drain electrodes 306 and 307 are formed by wet etching by using the photoresist 308 as a mask (FIG. 22C).

Figure 22D:
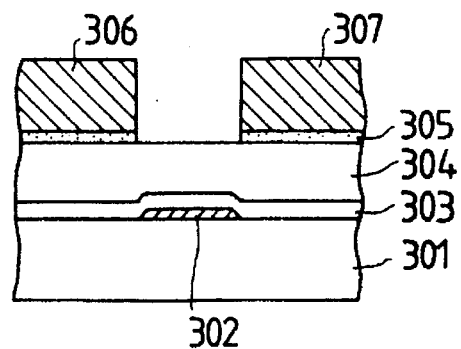

The n$^+$-type layer 305 is etched to a depth of 1,700 Å by RIE using the photoresist 308 as a mask, and then the photoresist 308 is removed (FIG. 22D).

Figure 22E:
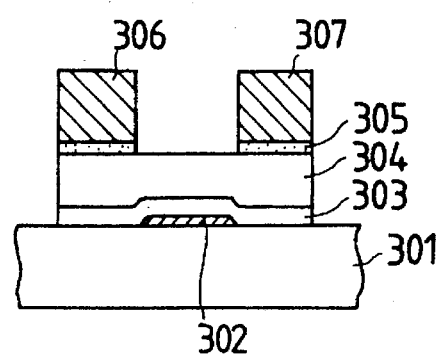
Figure 22F:
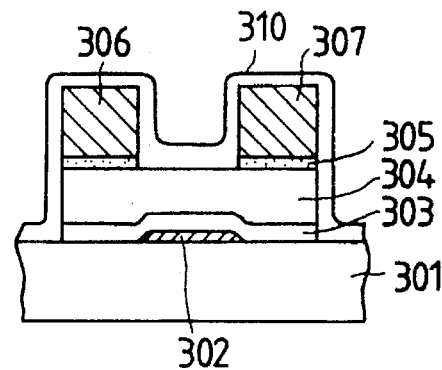

After patterning with a desired photoresist pattern is performed, unnecessary layers between the adjacent elements are removed (element isolation). Note that element isolation is performed by RIE (FIG. 22E). Subsequently, a protective layer 310 consisting of an impurity-doped silicon nitride film is formed on the surface of the thin film semiconductor formed in FIG. 22E by the plasma CVD method (FIG. 22F).

A method of forming the protective film 310 consisting of the impurity-doped silicon nitride film will be described below. A plasma is generated by a gas mixture of SiH$_4$ and NH$_3$, and silicon nitride is deposited on the substrate kept at a temperature T$_s$=330° C. by the plasma CVD method. A volume ratio R (SiH$_4$/NH$_3$) of the gas mixture of SiH$_4$ and NH$_3$ between 10$^{-1}$ to 10 is changed to set an optical band gap energy E$_g$ to 1.8 to 5.0 eV. In this embodiment, B$_2$H$_6$ gas is mixed as a doping gas in the mixture of SiH$_4$ and NH$_3$. For example, by setting the volume ratio R of the gas mixture of SiH$_4$ and NH$_3$ to be R=about 3, and by adding 10$^4$ ppm of B$_2$H$_6$ as a doping gas in the above gas mixture, the protective layer 310 consists of a silicon nitride film having a band gas energy E$_g$=about 2.4 eV and an active energy E$_a$=about 1.3 eV. This protective layer substantially has a p conductivity type. The a-Si:H layer constituting the thin film semiconductor layer has a band gap energy E$_g$=1.7 to 1.8 eV and E$_a$=0.7 to 0.75 eV. When the protective layer comprising the impurity-doped silicon nitride film is formed on the surface of the a-Si:H layer, the surface region of the a-Si:H layer is almost depleted.

As described above, the thin film transistor type photosensor of the third embodiment is prepared. B$_2$H$_6$ is used as a doping gas in the third embodiment. However, BH$_3$, B$_2$F$_6$, or BF$_6$ may be used in place of B$_2$H$_6$ as a doping gas.

Subsequently, thin film transistor type photosensors (A) of the present invention, and thin film transistor type photosensors (B) formed by the conventional method (FIGS. 3A and 3B) are formed on a large glass substrate having a size of 300 mm□ at intervals of about 20 mm.

A mark + in FIG. 22 represents a position of each thin film transistor type photosensor. A point 0 represents almost the center of the substrate. The electrical characteristics of the thin film transistor type photosensors are represented by dark currents Id, the threshold voltages V$_{th}$ of dark currents, photocurrents, and their temperature characteristics.

Figure 23:
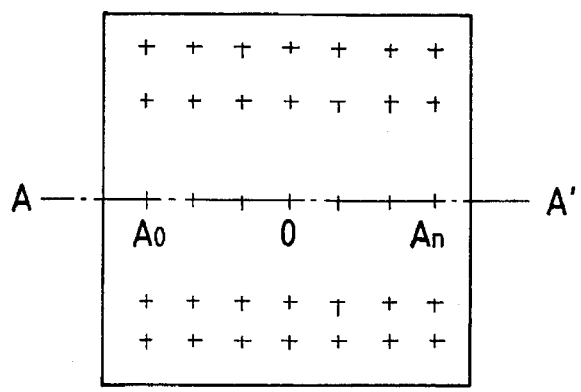
FIG. 23 is a view showing the position of the semiconductor device within the glass substrate having the large area.
Figure 24:
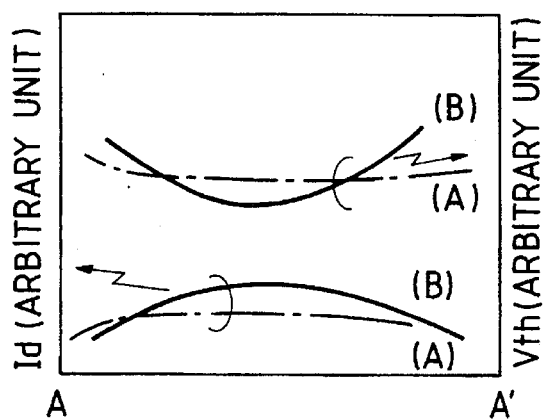
FIG. 24 is a graph showing the distributions of dark currents Id and threshold voltages at operating points of the thin film transistor type photosensor on the line A—A' of FIG. 23.

FIG. 24 shows the distribution of the dark currents Id at an operating point of the thin film transistor type photosensors located on the line A—A' in FIG. 23, and the distribution of threshold voltages V$_{th}$. The operating point is a gate voltage Vg=0 V.

As is apparent from FIG. 24, the dark current Id of the thin film transistor type photosensor (A) of the present invention is smaller than that of the conventional thin film transistor type photosensor (B), and the degree of nonuniformity (distribution) of the dark current Id of the thin film transistor type photosensor (A) is better than that of the conventional photosensor (B). The threshold voltages V$_{th}$ of the dark currents of the photosensors (A, B) are almost equal to each other, and a degree of nonuniformity (distribution) of the threshold voltages V$_{th}$ of the photosensor (A) is smaller than that of the photosensor (B).

Figure 25:
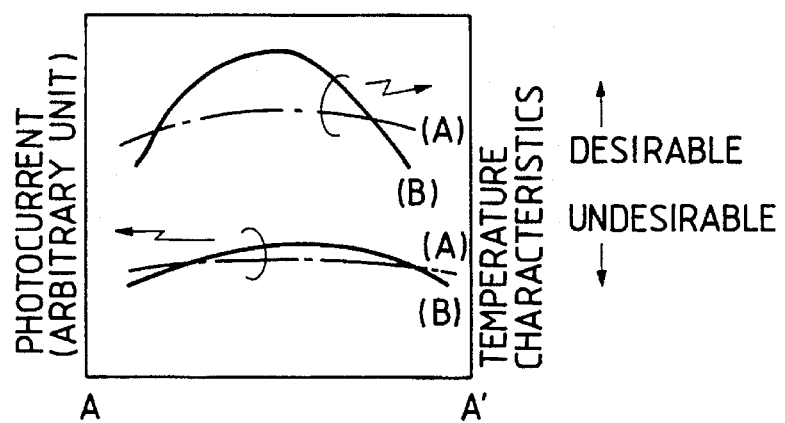
FIG. 25 is a graph showing the distributions of room-temperature photocurrents and temperature characteristics at operating points of the thin film transistor type photosensor on the line A—A' in FIG. 23.

FIG. 25 shows the distribution of room-temperature photocurrents at an operating point of the thin film transistor photosensors located on the line A—A' of FIG. 23, and temperature characteristics of the photocurrent (a photocurrent ratio at 60° C./25° C.; to be referred to as temperature characteristics).

If the gate voltage Vg is further finely adjusted in accordance with the distribution of the temperature characteristics of the photocurrent to correct the operating point, the distribution of the temperature characteristics of the photocurrent can also be eliminated in the conventional thin film transistor type photosensor (B).

As is apparent from FIG. 25, the photocurrent and the temperature characteristics of the thin film transistor type photosensor (A) of the present invention are larger and better than those of the conventional thin film transistor type photosensor (B). The temperature characteristics of the conventional thin film transistor type photosensor (B) are distributed in the range of 30% to 130% along the line A—A', and the distribution of photocurrents of the photosensors (B) ranges from about 10 to about 30% at room temperature.

Energy band diagrams in a dark state are estimated from the above as follows.

Figure 26A:
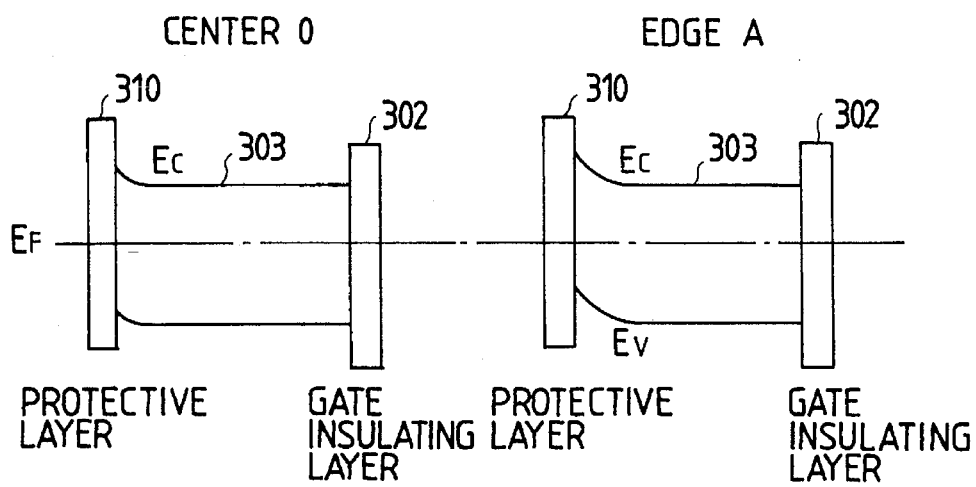
FIGS. 26A and 26B are energy band diagrams at points 0 and $A_0$ along the line A—A in FIG. 23.

FIG. 26A shows energy band diagrams of the thin film transistor of the present invention near the threshold voltage $V_{th}$ at point 0 as the center of the substrate and edge point A on the line A—A' in FIG. 23.

Figure 26B:
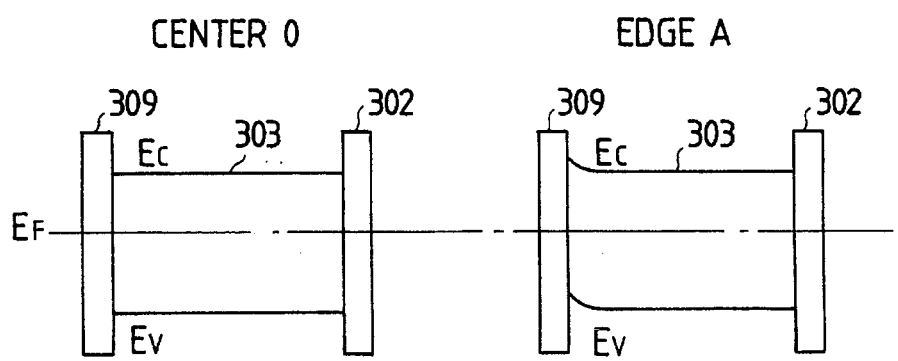

FIG. 26B shows energy band diagrams of the conventional thin film transistor near the threshold voltage $V_{th}$. As is apparent from these energy band diagrams, in the conventional thin film transistor type photosensor (B), the surface of the thin film semiconductor layer 304 includes an almost flat band state to a depletion state in a wide range from the center point 0 to the edge point A. To the contrary, in the thin film transistor type photosensor (A) of the present invention, the surface of the thin film semiconductor layer 304 is slightly depleted by an influence of the surface protective layer 310, and the depletion distribution is relatively small.

The temperature characteristics of the photocurrent are very important to determine an S/N ratio of a photosensor and are not necessarily satisfied by the temperature characteristics of the photocurrent shown in FIG. 25. According to the present invention, desired temperature characteristics of the photocurrent can be obtained by utilizing the dependency of the temperature characteristics of the photocurrent on the gate voltage.

Figure 27:
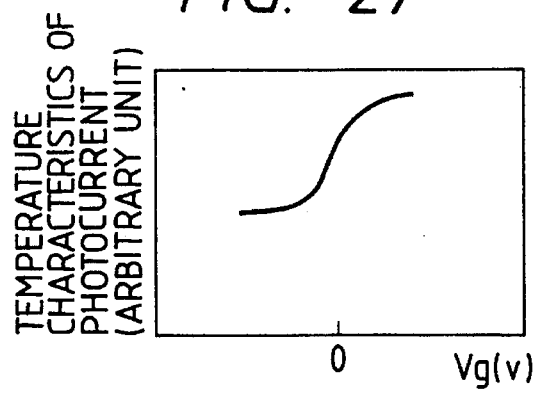
FIG. 27 is a graph showing the temperature characteristics of the photocurrent as a function of the gate voltage.

FIG. 27 shows dependency of the temperature characteristics of the photocurrent on the gate voltage. As shown in FIG. 27, the above object can be achieved by the gate voltage, as shown in FIG. 27.

(Fourth Embodiment)

In the fourth embodiment of the present invention, a drive circuit consisting of photosensors and thin film transistors manufactured in the process of the third embodiment is used as a one-dimensional contact type sensor array.

Figure 28:
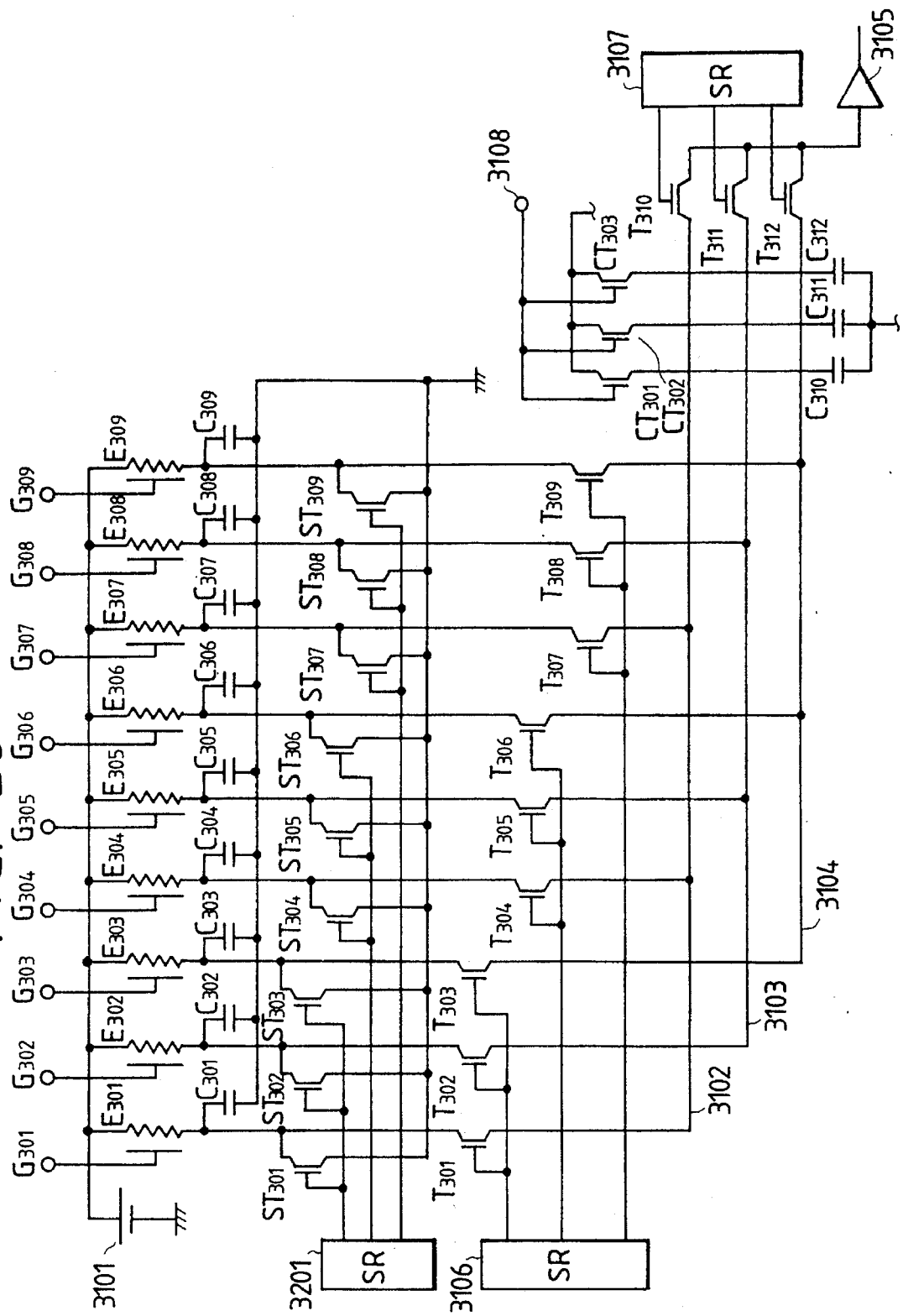
FIG. 28 is a circuit diagram of a perfect contact sensor circuit.

FIG. 28 shows an arrangement of a perfect contact type sensor constituted by the photosensors and the thin film transistors of the present invention.

A case of a sensor array having nine photosensors will be exemplified.

Referring to FIG. 28, three out of nine photosensors E301 to E309 constitute each block, and three blocks constitute a photosensor array. This applies to capacitors C301 to C309 and switching transistors T301 to T309 in correspondence with the photosensors E301 to E309. Individual electrodes having identical numbers in the respective blocks constituted by the photosensors E301 to E309 are connected to one of common lines 3102 to 3104.

More specifically, the first switching transistors T301, T304, and T307 of each block are connected to the common line 3102, the second switching transistors T302, T305, and T308 of each block are connected to the common line 3103, and the third switching transistors T303, T306, and T309 are connected to the common line 3104. The common lines 3102 to 3104 are connected to an amplifier 3105 through switching transistors T310 to T312.

The gate electrodes of switching transistors ST301 to ST309 are commonly connected in units of blocks as in the gate electrodes of the switching transistors T301 to T309 and are connected to parallel output terminals of a shift register 3201 in units of blocks. The switching transistors ST301 to ST309 are sequentially turned on in units of blocks in response to shift timing pulses of the shift register 3201.

Referring to FIG. 28, the common lines 3102 to 3104 are formed through capacitors C310 to C312, respectively and are grounded through switching transistors CT301 to CT303.

The capacitance of each of the capacitors C310 to C312 is sufficiently larger than that of each of the capacitors C301 to C309. The gate electrodes of the switching transistors CT301 to CT303 are commonly connected, and the common node is connected to a terminal 3108. That is, when the terminal 3108 is set at high level, the switching transistors CT301 to CT303 are simultaneously turned on, and the common lines 3102 to 3104 are grounded.

Each sensor comprises a thin film transistor type photosensor, and gate electrodes G301 to G309 correspond to the sensors E301 to E309, respectively.

Figure 29A:
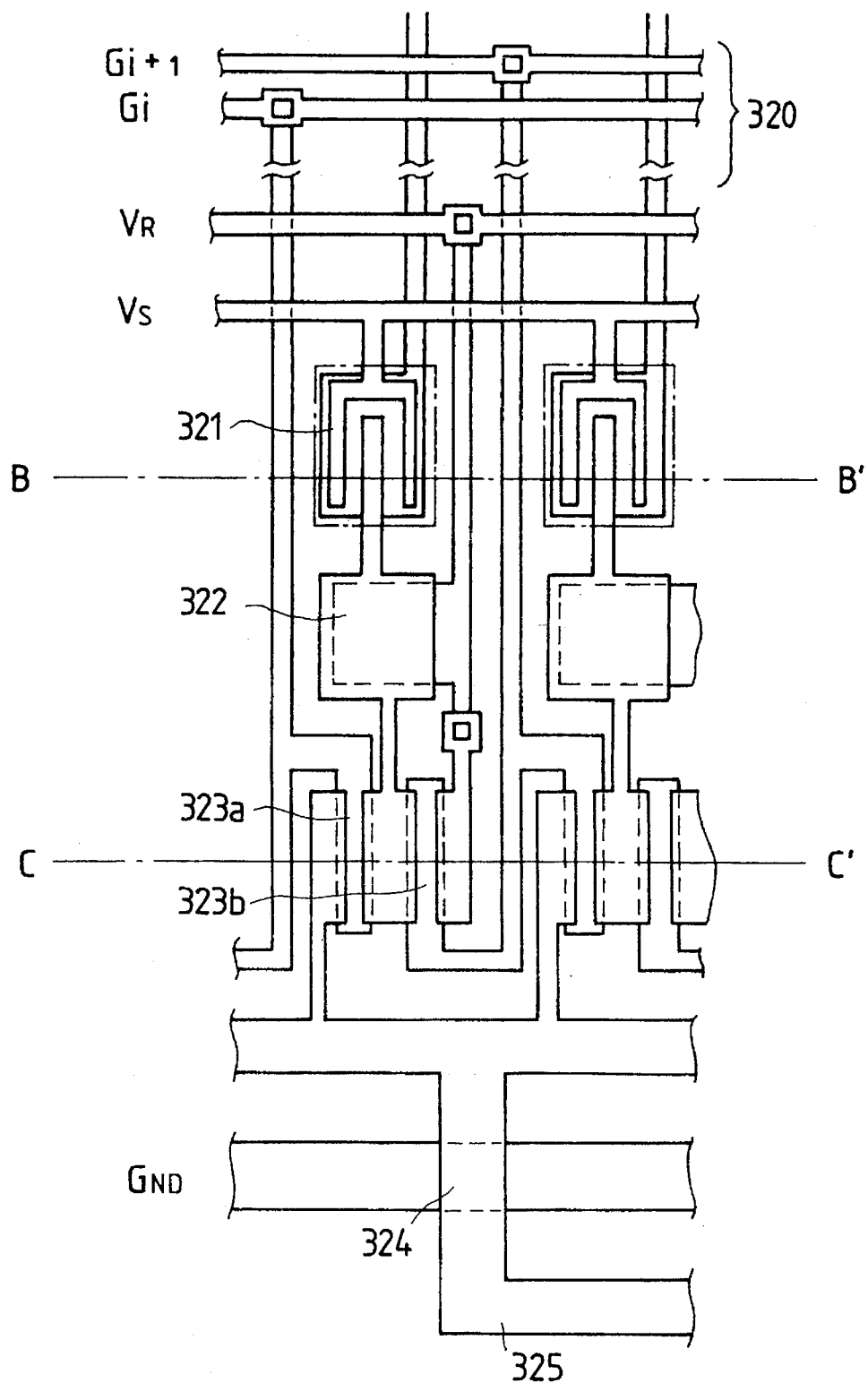
FIG. 29A is a plan view showing part of the perfect contact sensor formed on the basis of the circuit shown in FIG. 28.

FIG. 29A is a plan view showing part of a perfect contact sensor arranged on the basis of the circuit diagram of FIG. 28.

Referring to FIG. 29A, a wiring unit 320 is formed in a matrix form. A photosensor unit 321 is formed by using a thin film transistor photosensor. A transfer switch 323a is arranged by using a thin film transistor of the present invention. A discharge switch 323b is arranged by utilizing the thin film transistor of the present invention to reset the charge of a charge storage unit 322. A lead line 325 connects a transfer switch signal output to a signal processing IC. A load capacitor 324 stores the charge transferred by the transfer switch 323a and reads out the transferred charge. In this embodiment, an a-Si:H film is used as a photoconductive semiconductor layer constituting the photosensor unit 321, the transfer switch 323a, and the discharge switch 323b. A plasma-CVD silicon nitride film is used as an insulating layer.

Referring to FIG. 29A, only upper and lower wiring layers are illustrated for illustrative convenience, and the thin film semiconductor layer and the insulating layer are not illustrated. An $n^+$-type layer is formed at the interface between the upper electrode wiring layer and the thin film semiconductor layer to achieve an ohmic contact.

Figure 29B:
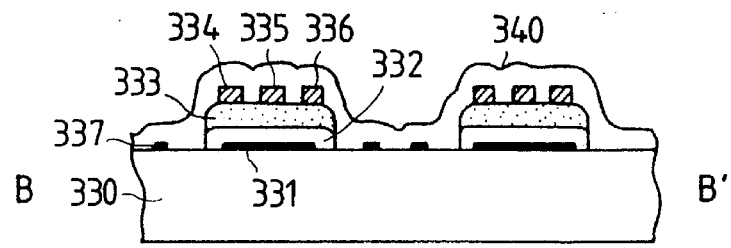
FIGS. 29B and 29C are sectional views of the perfect contact sensor shown in FIG. 28.

FIG. 29B is a longitudinal sectional view of the photosensor unit 321. The photosensor unit 321 comprises a lower electrode wiring layer 331 serving as a gate electrode, an insulating layer 332 serving as a gate insulating layer, a thin film semiconductor layer 333, an upper electrode wiring layer 335 serving as a source electrode, an upper electrode wiring layer 334 serving as a drain electrode, and a protective layer 340 converted into a p-type layer containing B (boron) as an impurity.

Figure 29C:
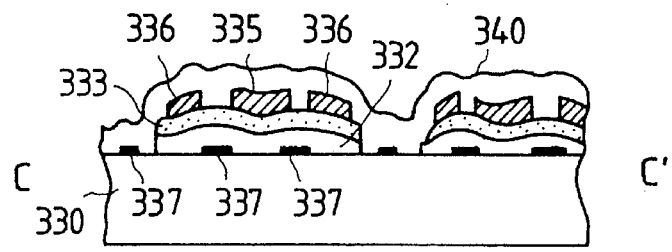

FIG. 29C is a longitudinal sectional view of the transfer switch 323a and the discharge switch 323b. The transfer switch 323a comprises a lower electrode wiring layer 337 serving as a gate electrode, the insulating layer 332 serving as a gate insulating layer, the thin film semiconductor layer 333, and the upper electrode wiring layer 335 serving as a source electrode. The gate insulating layer and the thin film semiconductor layer of the discharge switch 323b are the same as the insulating film 332 and the thin film semiconductor layer 333. The source electrode consists of the upper electrode wiring layer 335, the gate electrode consists of the lower electrode wiring layer 337, and the drain electrode consists of an upper electrode wiring layer 336. The transfer switch 323a and the discharge switch 323b are covered with the protective layer 340 consisting of a p-type layer containing B (boron) as an impurity. As described above, an ohmic contact layer is formed between the upper electrode wiring layers 334, 335, and 336 of the photosensor unit, the transfer switch, and the discharge switch and the thin film semiconductor layer 333.

According to the present invention, since the protective layer comprising a p-type layer containing an impurity is arranged, the temperature characteristics of the photocurrent can be set to fall within the range of 60 to 70%. At the same time, the dependency of the temperature characteristics of the photocurrent on the gate voltage as indicated in the third embodiment is utilized in the thin film transistor type photosensor to control the voltage of the gate electrode 331, thereby further improving the temperature characteristics of the photocurrent. Since the switching transistors T301 to T309, and ST301 to ST309 are covered with the p-type protective layer containing an impurity, no practical problem is posed.

Figure 30:
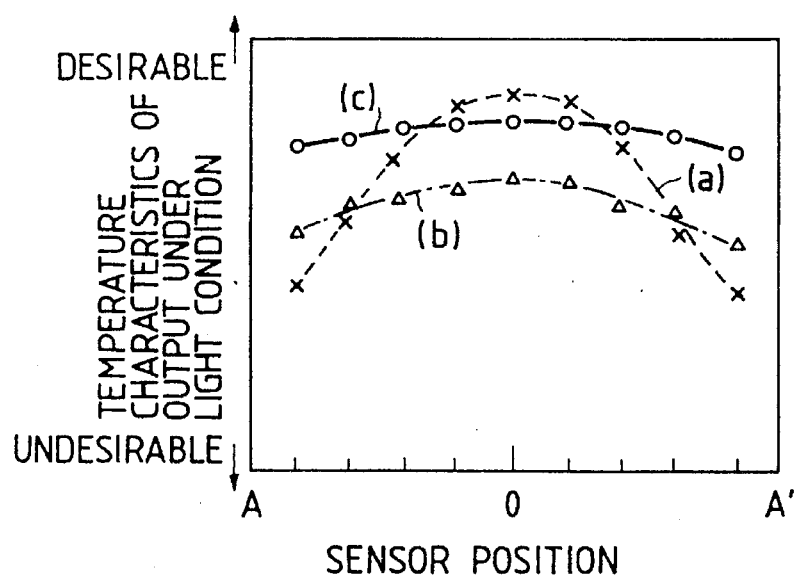
FIG. 30 is a graph showing comparison of the temperature characteristics of outputs under light condition of the perfect contact sensor shown in FIGS. 29A, 29B, and 29C.

FIG. 30 shows the distribution of the temperature characteristics of an output under light condition (an output obtained when a white original is read) in the one-dimensional perfect contact sensor formed on a large substrate. The one-dimensional perfect contact sensor is formed such that photosensors are aligned on the line A—A' in FIG. 23.

The distributions of the temperature characteristics of outputs under light condition in the one-dimensional contact sensor array (A) using photosensors and thin film transistors of the present invention and a one-dimensional perfect contact sensor array (B) using the conventional photosensors and thin film transistors are indicated by a broken curve (a) and an alternate long and short dashed curve (b) in FIG. 30, respectively. The distribution of outputs on light condition of the one-dimensional perfect contact sensor array (A) of the present invention is better than that of the conventional one-dimensional perfect contact sensor array (B), but has poor temperature characteristics of outputs on light condition.

According to the present invention, gate voltages are respectively applied to the gate electrodes G301 to G309 shown in FIG. 28 to improve the temperature characteristics of outputs on light condition, as indicated by a solid line (c) in FIG. 30. The distribution of the temperature characteristics of outputs on light condition and the magnitudes of the temperature characteristics are improved, as indicated by the solid curve (c) of FIG. 30.

The one-dimensional contact sensor array of the present invention can be used as a lensless perfect contact sensor array for reading an original 16 upon radiation of light from a light source 13 to the lower surface of the sensor after an anti-wear layer 11 is formed on the upper surface of the photosensor, as shown in FIG. 19.

The one-dimensional contact sensor array can also be used as a contact sensor array using a one-to-one size focusing lens (SELFOC lens available from Nippon Sheet Glass Co., Ltd.) 12 shown in FIG. 20.

Figure 31:
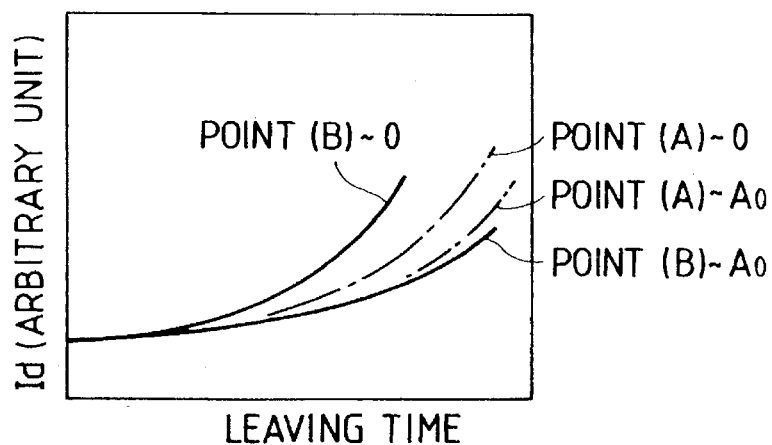
FIG. 31 is a graph showing high-temperature, high-humidity test results of the perfect contact sensor.

Results of a high-temperature, high-humidity test at 60° C. and 90% of a contact type sensor array (A) of this embodiment and a contact type sensor array (B) formed by the conventional method are shown in FIG. 31.

The perfect contact type sensor array of this embodiment and the conventional perfect contact type sensor array have better humidity resistance than a contact type sensor array having no protective layer due to the presence of the protective layer 309 (or 310).

Moisture permeation is found even in the presence of the protective layer in accordance with high-temperature, high-humidity conditions and leaving time.

Referring to FIG. 31, an operating point is set to be the gate voltage Vg=0 V, and dark currents Id at points 0 and $A_0$ on the line A—A' of FIG. 23 are plotted as a function of leaving time.

As is apparent from FIG. 27, the humidity resistance values are larger in an order of point (B)-0, point (A)-0, point (A)-$A_0$, and point (B)-$A_0$.

Figure 32A:
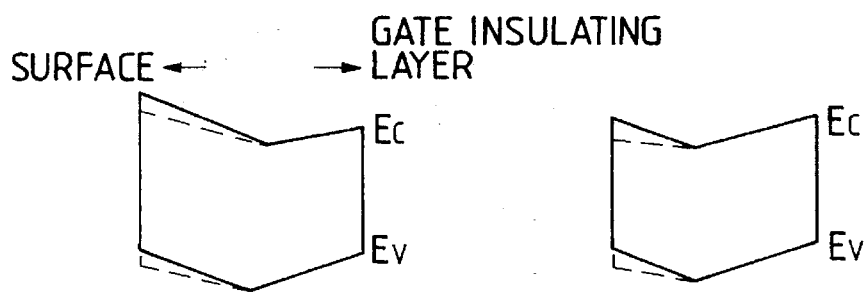
FIGS. 32A and 32B are energy band diagrams estimated from the high-temperature, high-humidity test.
Figure 32B:
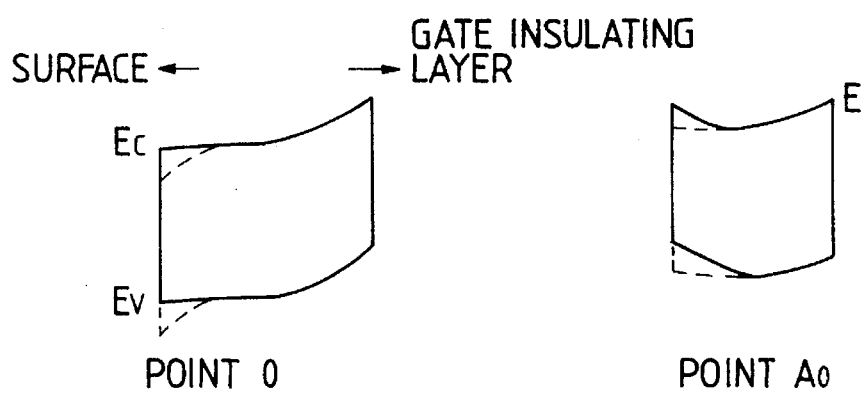

FIGS. 32A and 32B show changes in energy band diagrams as a function of leaving time assumed in the test. Note that only the bands of the thin film semiconductor layer 304 are illustrated for illustrative convenience.

The initial state is represented by the solid line, and the state after leaving is represented by the broken line. FIG. 32A shows changes in energy bands at points 0 and $A_0$ of the present invention (A). As is apparent from FIG. 32A, the surface layer is depleted after the test. To the contrary, FIG. 32B shows changes in energy bands at point 0 according to the conventional method (B). In the energy band diagram, the surface layer is close to an almost flat band state or a storage state. In this thin film transistor, a change in surface state greatly influences a change in Id. The energy band diagram at point $A_0$ represents a depletion state. Large differences are present between changes at points 0 and $A_0$ in the humidity test, and an increase in distribution occurs.

As described above, humidity resistance can be obtained by a protective layer. When the surface layer of the thin film semiconductor layer is set in a depletion state, an increase in dark current Id can be suppressed, and the distribution of changes is assumed to be limited accordingly.

In the third and fourth embodiments, B (boron) is doped as an impurity in the protective layer. The dark current, photocurrent, and their temperature characteristics can be controlled by the type of dopant and the doping amount. In addition, it is also to improve the distribution.

The main gist of the present invention is to sufficiently improve the humidity resistance and to correct the operating point so as to obtain desired characteristics.

In the third and fourth embodiments, an impurity-doped protective layer is formed on the thin film semiconductor layer from which the $n^+$-type layer is removed. However, an impurity-doped protective layer may be formed on a thin film semiconductor layer in advance, contact holes may be formed in the protective layer, and an $n^+$-type layer and metal layers for forming the source and drain electrodes may be formed.

In the embodiments of the present invention, hydrogenated amorphous silicon is exemplified. However, another thin film semiconductor such as polysilicon and CdS may be used to obtain the same effect as described above.

(Fifth Embodiment)

FIGS. 33A, 33B, 33C, 33D, and 33E are illustrative sectional views for explaining the steps in manufacturing a photosensor according to the fifth embodiment.

The manufacturing steps will be described below in order.

Figure 33A:
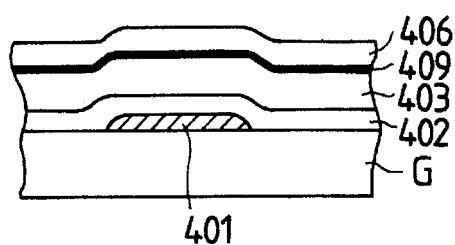
FIGS. 33A, 33B, 33C, 33D, and 33E are sectional views for explaining the steps in manufacturing a photosensor according to the present invention.

Cr is used to selectively form a gate electrode 401 on an insulating substrate (glass substrate) G. A 3,000-Å thick hydrogenated amorphous silicon nitride film (a-$SiN_2$:H) serving as a gate insulating film 402, a 5,000-Å thick hydrogenated amorphous Si (a-Si:H) serving as a thin film semiconductor layer 403, and a p-type layer 409 serving as a surface layer of the thin film semiconductor layer 403, lightly doped with $BH_3$ as a doping material so as to change the Fermi level by about 0.2 eV, and an n⁺-type layer 406 having a thickness of 300 to 500 Å are sequentially deposited on the insulating substrate G by the plasma CVD method (FIG. 33A).

Figure 33D:
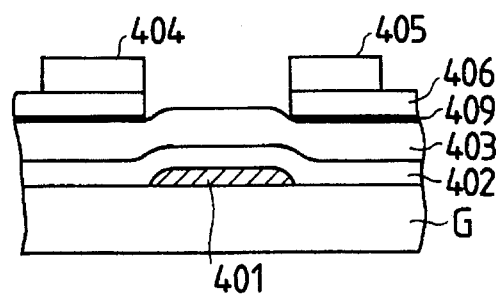
Figure 33B:
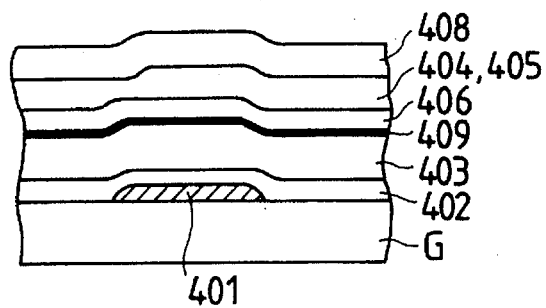

Subsequently, a 1-μm thick aluminum (Al) serving as a source electrode 404 and a drain electrode 405 is deposited by sputtering, and a photoresist 408 for patterning the electrodes is applied to the uppermost surface (FIG. 33B).

Figure 33E:
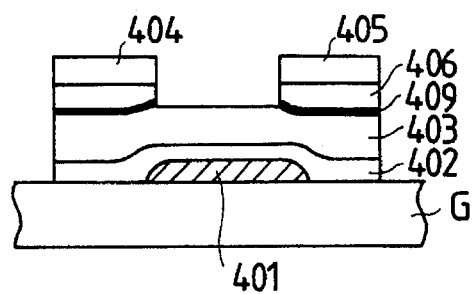
Figure 33C:
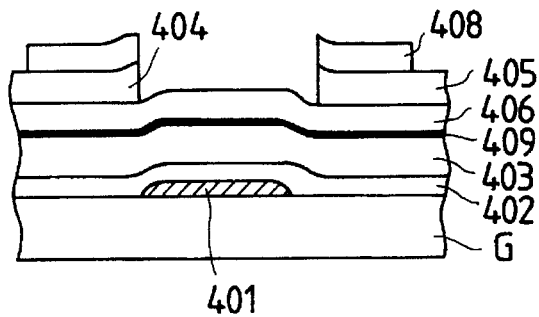

The photoresist 408 is patterned to have a desired shape, and the source and drain electrodes 404 and 405 are formed by wet etching using the photoresist pattern as a mask (FIG. 33C).

The n⁺-type layer 406 and the p-type layer 409 are etched to a depth of 1,700 Å by RIE using the photoresist 408 as a mask. In this state, a p-type layer having a thickness of 100 to 300 Å is left on the gap surface of the thin film semiconductor layer 403 (FIG. 33D).

The resultant structure is patterned into a desired shape by the photoresist 408, and element isolation is performed by RIE (FIG. 33E).

The photosensor of this embodiment is manufactured by the above steps.

Photosensors of the present invention and conventional photosensors shown in FIGS. 2A and 2B are formed on a glass substrate having a large area (300 mm²) at a pitch of about 20 mm.

Figure 34:
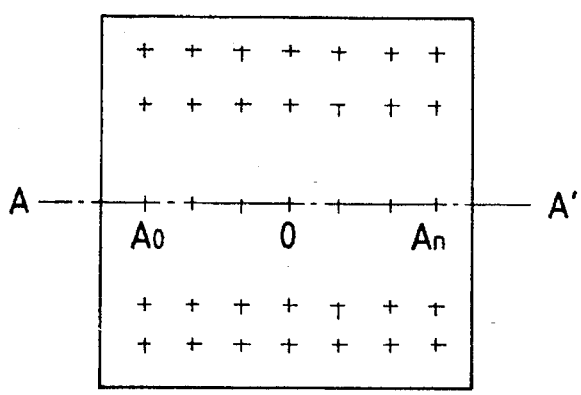
FIG. 34 is a plan view showing the layout of photosensors formed on the substrate.

FIG. 34 is a view showing the layout of photosensors formed on the substrate. A mark + represents a position of each photosensor, 0 represents the center of the substrate, and $A_0$ and $A_n$ represent positions of photosensors at the edges of the substrate along the line A—A'.

The electrical characteristics of the photosensors are represented by dark currents Id, threshold voltages $V_{th}$, photocurrents, and temperature characteristics of the photocurrents.

Figure 35:
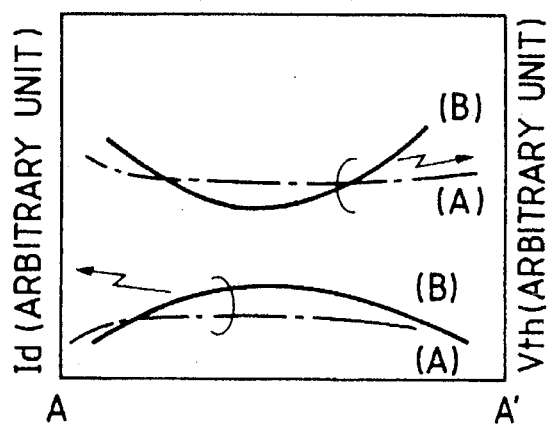
FIG. 35 is a graph showing the distribution of dark currents Id of operating points of the photosensor on the line A—A' of FIG. 34 and the distribution of threshold voltages $V_{th}$ thereof (dotted curves (A)), and those of a conventional photosensor (solid curves (B))

FIG. 35 is a graph showing the distributions of dare currents Id and threshold voltages $V_{th}$ at an operating point of the photosensors of this embodiment (indicated by a dotted curve (A)) along the line A—A' in FIG. 34, and those of a conventional photosensor (solid curve (B)). In this case, the operating point is given as a gate voltage of 0 V.

As shown in FIG. 35, in the photosensor according to the embodiment of the present invention, the dark current Id is slightly smaller and the distribution is also smaller than in the conventional photosensor. In addition, the distribution of the threshold voltage $V_{th}$ of the dark current Id is reduced, i.e., improved.

Figure 36:
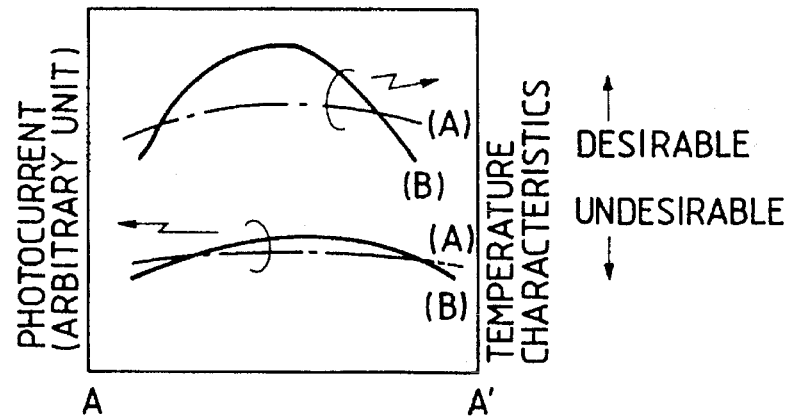
FIG. 36 is a graph showing the distribution of room-temperature photocurrents at an operating point of the photosensor along the line A—A' and the distribution of temperature characteristics (a photocurrent ratio at 60° C./20° C.) of the photocurrent of the photosensor thereof (dotted curves (A)), and those of a conventional photosensor (solid curves (B))

FIG. 36 is a graph showing the distribution of room-temperature photocurrents at an operating point (Vg=0) of the photosensor along the line A—A' and the distribution of temperature characteristics (a photocurrent ratio at 60° C./20° C.) of the photocurrent of the photosensor thereof (dotted curves (A)), and those of a conventional photosensor (solid curves (B)).

As is apparent from FIG. 36, the photocurrents and temperature characteristic values of the photosensors of this embodiment are smaller than those of the conventional photosensor, so that the uniformity can be greatly improved. Note the conventional photosensor has a large temperature characteristic distribution of 0.2 to 0.9 on the A—A' line, and its photocurrents have a distribution of about 10 to about 30% at room temperature.

Figure 37A:
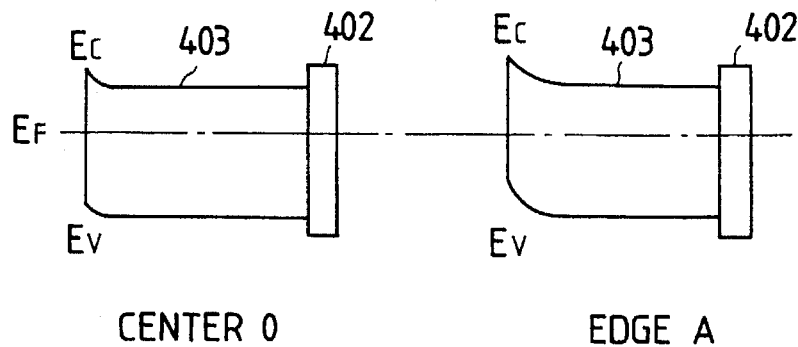
FIG. 37A shows energy band diagrams at the central point 0 and an edge $A_0$ (or $A_n$) of a thin film semiconductor layer 3 of the substrate near the threshold voltage of the photosensor of the present invention.
Figure 37B:
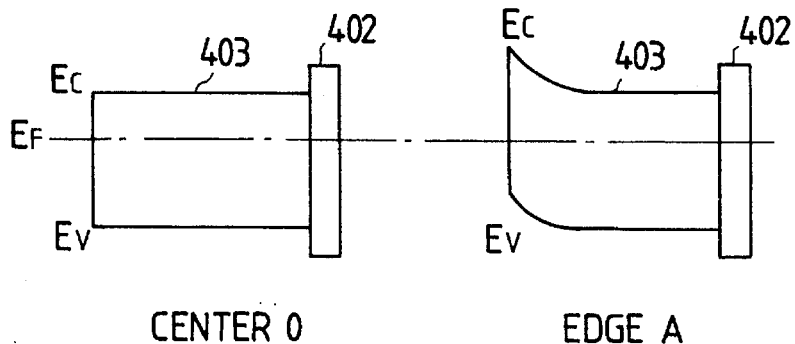
FIG. 37B shows energy band diagrams at the same points as in FIG. 37A of a conventional photosensor.

FIG. 37A shows energy band diagrams of the photosensor of this embodiment near the threshold voltage at the center 0 and the edge $A_0$ (or $A_n$), whereas FIG. 37B shows energy band diagrams of the conventional photosensor under the same condition.

As is apparent from FIGS. 37A and 37B. depletion typically occurs near the surface in the band gap diagrams of the conventional photosensor, so that the distribution is large. To the contrary, depletion near the surface of the photosensor of this embodiment is limited because the p-type layer having a thickness of 100 to 300 Å is left as a surface layer, and the distribution is apparently small.

Figure 38:
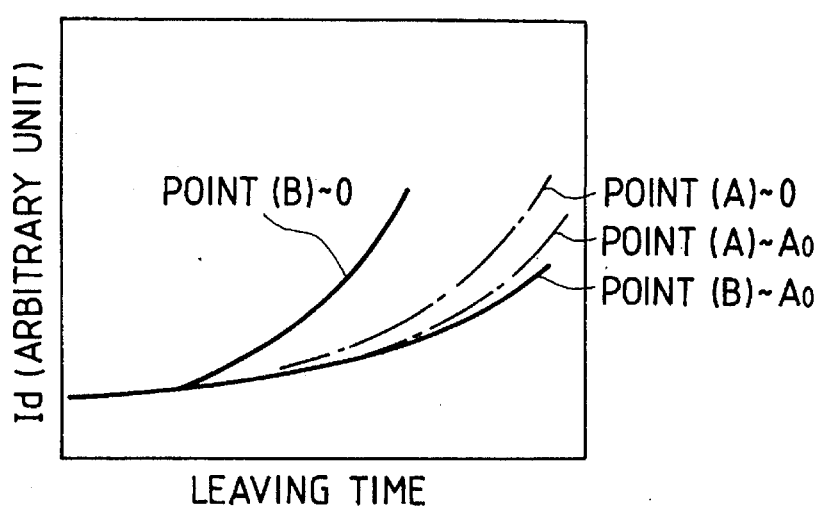
FIG. 38 is a graph showing leaving test results of dark currents Id at operating points at the points 0 and $A_0$ (or $A_n$) on the line A—A' of the photosensor of the present invention (dotted curves (A)) at a high temperature (e.g., 60° C.) and a high humidity (90%) and those of the conventional photosensor (solid curves (B))

FIG. 38 is a graph showing results of a high-temperature, high-humidity test (temperature: 60° C.; humidity: 90%) for the dark currents Id at the operating points as the points 0 and $A_0$ (or $A_n$) on the A—A' line. Test results of the photosensor of this embodiment are represented by the dotted curves (A), and those of the conventional photosensor are represented by the solid curves (B).

As is apparent from FIG. 38, the humidity resistance can be improved in an order of point (B)-$A_0$, point (A)-$A_0$ (or $A_n$), point (A)-0, and point (B)-0 and in the photosensor of this embodiment has a better uniformity than the conventional photosensor.

Figure 39A:
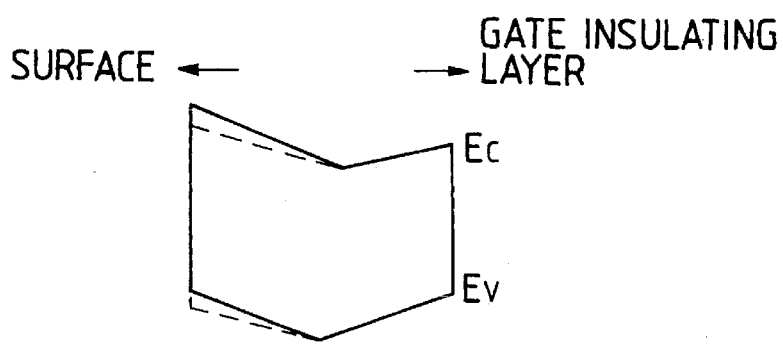
FIG. 39A shows changes in energy bands of the photosensor of the present invention at the point $A_0$ ($A_n$) with a lapse of time in the initial period (solid line) and upon leaving (broken line), which changes are assumed in accordance with the test in FIG. 38.
Figure 39B:
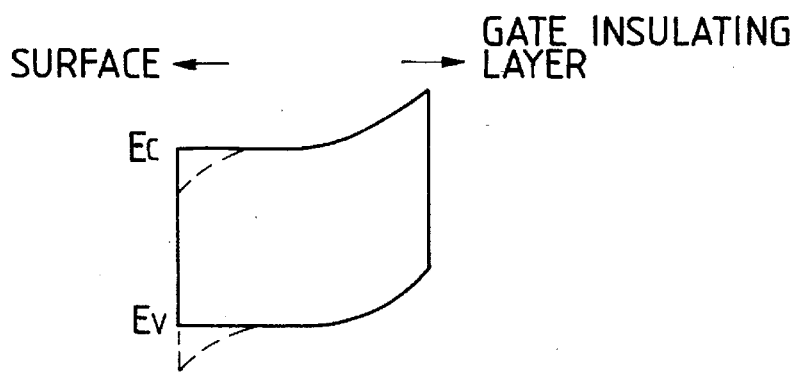
FIGS. 39B shows changes in energy bands of the conventional photosensor at the point 0 under the same conditions as in FIG. 39A.

FIG. 39A is a view showing changes in energy band of the photosensor of this embodiment at point $A_0$ (or $A_n$) as a function of leaving time estimated in the test of FIG. 38 in the initial state (represented by the solid line) and in a state after the test (indicated by the broken line). FIG. 39B is a view showing changes in energy band of the conventional photosensor at point 0 under the same condition. As is apparent from FIGS. 39A and 39B, the band of the conventional photosensor is changed toward the electron storage side, and the dark current Id is large. To the contrary, the surface layer of the photosensor of this embodiment can maintain a depletion state upon leaving.

As is apparent from the above description, the humidity resistance depends on the band state near the surface of the thin film semiconductor layer 403. If a portion near the surface is depleted, the band state of the initial period can be maintained upon leaving. In the above embodiment, boron or the like is lightly doped in the surface layer. However, a doping species can be replaced with a halide doping species such as $BF_3$, and the humidity resistance can be further improved by changing the doping amount and the layer thickness.

In the above embodiment, the p-type layer is formed between the n⁺-type layer 406 and the thin film semiconductor layer 403. However, after the n⁺-type layer 406 and the thin film semiconductor layer 403 are sequentially deposited, a predetermined process may be performed, and then boron or the like may be doped in the surface of the thin film semiconductor layer 403.

The temperature characteristics of the photocurrent are important to determine an S/N ratio of the photosensor. As shown in FIG. 36, it is not sufficient to uniform the temperature characteristics of the photocurrent by forming the p-type layer. In this embodiment, by utilizing dependency of temperature characteristics of the photocurrent on the gate bias voltage, desired temperature characteristics of the photocurrent could be obtained.

Figure 40:
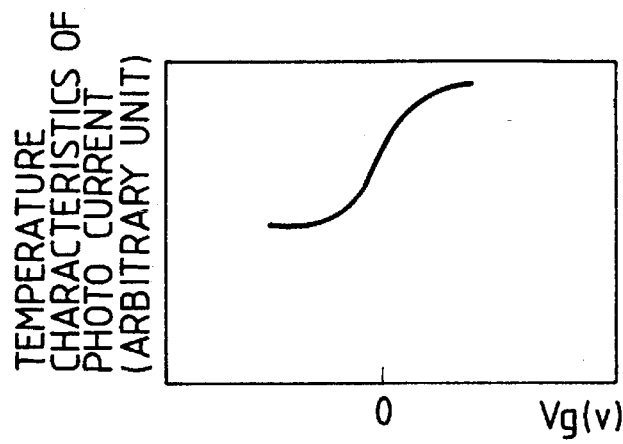
FIG. 40 is a graph showing temperature characteristics of the photocurrent as a function of the gate bias voltage.

FIG. 40 shows dependency of temperature characteristics of the photocurrent on the gate bias voltage.

As is apparent from FIG. 40, the temperature characteristics of the photocurrent Id are increased from the negative side to the positive side of the gate bias voltage Vg. The temperature characteristics exceed 100% and are saturated. When an operating point is selected to be an appropriate positive value (generally 0<(Operating Point)<$V_{th}$), it is apparent that the temperature characteristics can be improved. For example, the temperature characteristics of the photocurrent can be increased from the range of 30 to 40% to the range of 60 to 70% when the operating point is changed from Vg=0 (Vd=10 V) to the Vg=1 V (Vd=10 V). When the voltage Vg is set to be an extremely large positive value, the dark current Id is increased and the S/N ratio is decreased, as is apparent from FIG. 35A. Therefore, the operating point voltage cannot be set to be an extremely large positive value.

As described above, the humidity resistance is improved by forming a p-type layer in the surface layer, and at the same time the operating point of the TFT type sensor is adjusted to correct the temperature characteristics of the photocurrent by the gate voltage, thereby obtaining almost uniform characteristics on a large substrate.

(Sixth Embodiment)

Figure 41:
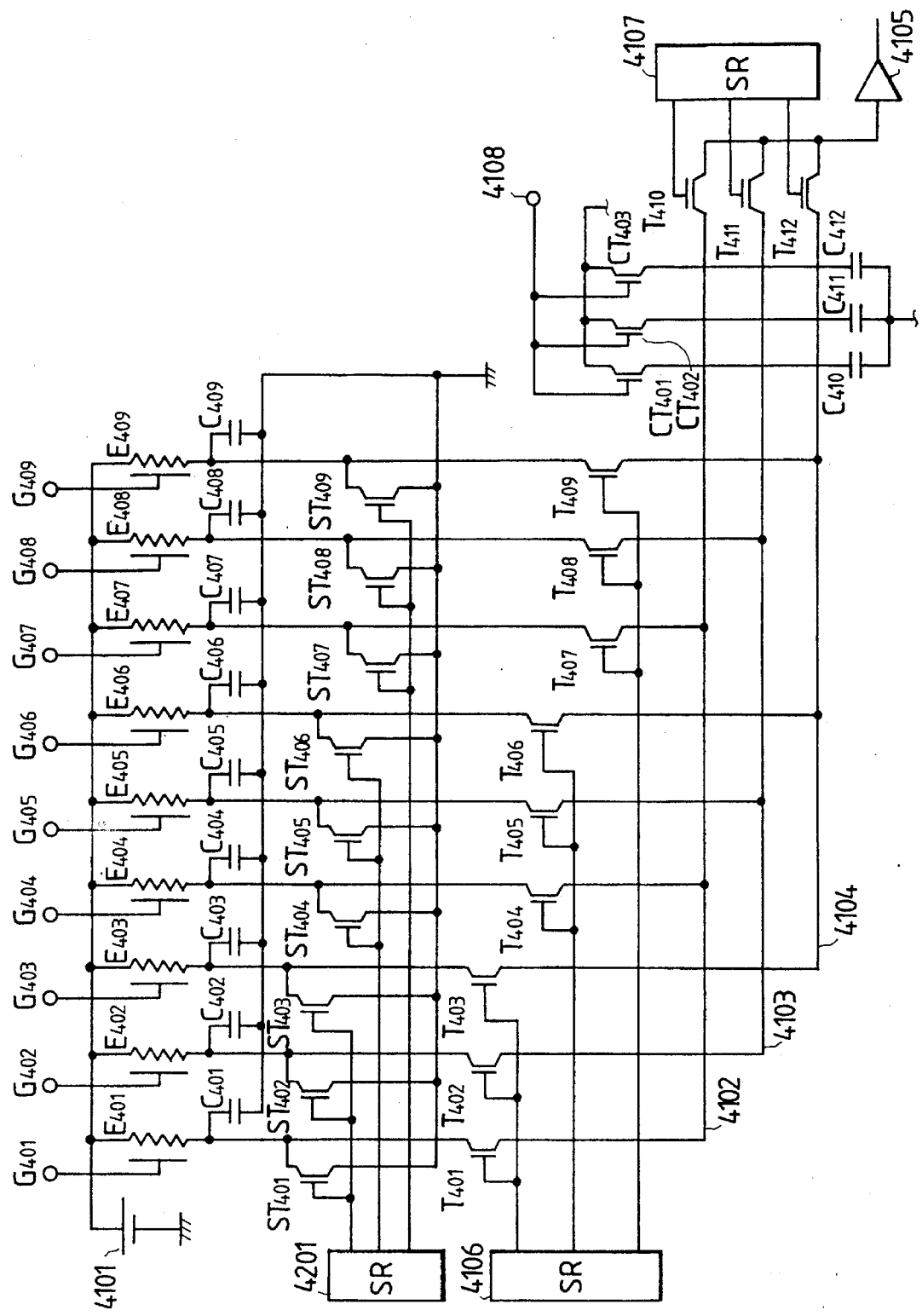
FIG. 41 is a circuit diagram of a one-dimensional contact type photosensor array as a photoelectric transducer apparatus constituted by using the photosensor of the present invention and a driver consisting of thin film transistors formed by the same process as the photosensor of the present invention.

FIG. 41 is a circuit diagram of a one-dimensional contact type photosensor array serving as a photoelectric transducer apparatus constituted by using a drive circuit including photosensors of the fifth embodiment and thin film transistors manufactured following the same procedures as in the photosensors of the fifth embodiment.

Referring to FIG. 41, the one-dimensional contact type optical sensor array includes photosensors E401 to E409, charge storage capacitors C401 to C409 for storing charges corresponding to outputs from the photosensors E401 to E409, and charge output transfer switching transistors T401 to T409 for transferring the charge outputs from the charge storage capacitors C401 to C409. Bias voltage applying gate electrodes G401 to G409 adjust the temperature characteristics of the photosensors E401 to E409. Discharge switching transistors ST401 to ST409 discharge the charge storage capacitors C401 to C409. Three out of the nine photosensors E401 to E409 constitute each block, and three blocks constitute a photosensor array. This arrangement is also applied to the transfer switching transistors T401 to T409 and the discharge switching transistors ST401 to ST409 in correspondence with the photosensors E401 to E409.

Individual electrodes having the same numbers in each of the blocks constituting the photosensors E401 to E409 are commonly connected to one of common lines 4102 to 4104 through transfer switching transistors T401 to T409.

More specifically, the first switching transistors T401, T404, and T407 of each block are connected to the common line 4102, the second switching transistors T402, T405, and T408 of each block are connected to the common line 4103, and the third switching transistors T403, T406, and T409 of each block are connected to the common line 4104. The common lines 4102 to 4104 are connected to an amplifier 4105 through switching transistors T410 to T412.

The gate electrodes of the transfer switching transistors T401 to T409 and the gate electrodes of the discharge switching transistors ST401 to ST409 are commonly connected in units of blocks and are connected to parallel output terminals of shift registers 4201 and 4106. The output transfer and discharge of the charge storage capacitors C401 to C409 are sequentially performed in response to shift timing pulses of the shift registers 4201 and 4106. The common lines 4102 to 4104 are arranged through capacitors C410 to C412 and are grounded through switching transistors CT401 to CT403.

The capacitances of the capacitors C410 to C412 are set to be larger than those of the capacitors C401 to C409. The gate electrodes of the switching transistors CT401 to CT403 are commonly connected, and the common node is connected to a terminal 4108. That is, when a signal of high level is applied to the terminal 4108, the switching transistors CT401 to CT403 are simultaneously turned on, and the common lines 4102 to 4104 are grounded and reset.

Figure 42A:
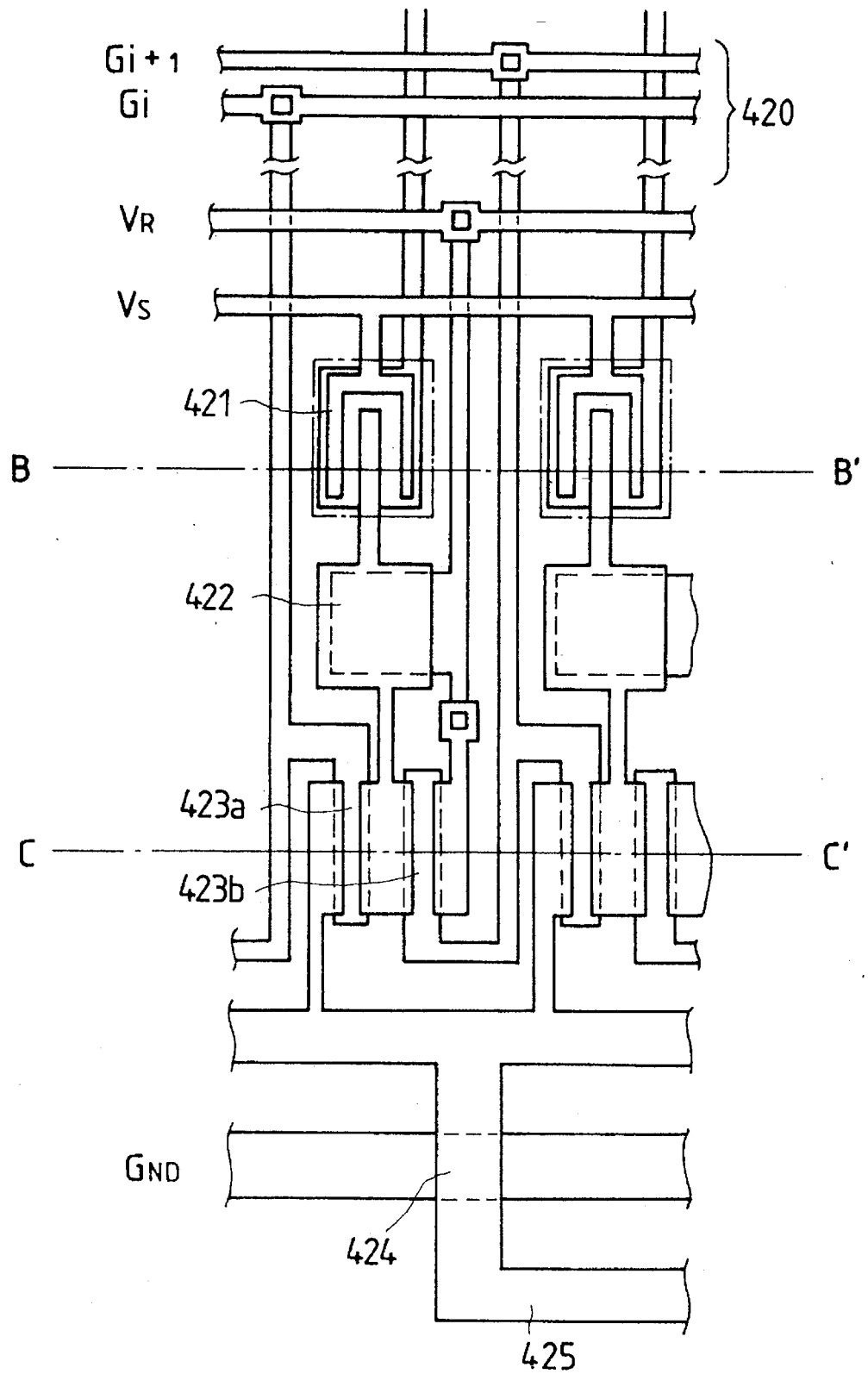
FIG. 42A is a plan view of a one-dimensional contact sensor portion on a substrate in correspondence with the circuit diagram of FIG. 41.

FIG. 42A is a plan view of a one-dimensional contact sensor formed on a substrate in correspondence with the circuit diagram shown in FIG. 41.

Referring to FIG. 42A, the one-dimensional contact sensor comprises a wiring unit 420 formed in a matrix form, a photosensor unit 421 of the present invention, a charge storage capacitor 422, an output transfer switching transistor 423a comprising a thin film transistor of the present invention and serving to transfer an output from the charge storage capacitor 422, a charge switching transistor 423b for resetting a charge of the charge storage capacitor 422, a lead line 425 for connecting a signal output from the transfer switching transistor 423a to a signal processing IC, and a load capacitor 424 for storing and reading the charge transferred through the transfer switching transistor 423a. In this embodiment, a photoconductive semiconductor layer constituting the photosensor unit 421, the transfer switching transistor 423a, and the discharge switching transistor 423b comprises an a-Si:H film, and a plasma-CVD silicon nitride film is used as an insulating layer.

Referring to FIG. 42A, only upper and lower wiring layers 402 are illustrated for illustrative convenience, and the photoconductive semiconductor layer and the insulating layer are not illustrated. Note that an $n^+$-type layer is formed at the interface between the upper electrode wiring layer and the photoconductive semiconductor layer to achieve an ohmic contact.

Figure 42B:
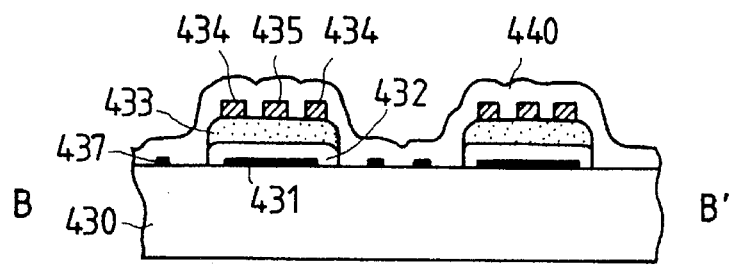
FIGS. 42B and 42C are sectional views of the one-dimensional contact sensor portion shown in FIG. 42A.

FIG. 42B is a longitudinal sectional view of the photosensor unit 421. The photosensor unit 421 comprises a lower electrode wiring layer 431 serving as a gate electrode, an insulating layer 432 serving as a gate insulating layer, a photoconductive semiconductor layer 433, an upper electrode wiring layer 434 serving as a drain electrode, an upper electrode wiring layer 435 serving as a source electrode, a protective layer 440 consisting of a polyamide resin, and a p-type layer 441 formed in the surface of the photoconductive semiconductor layer.

Figure 42C:
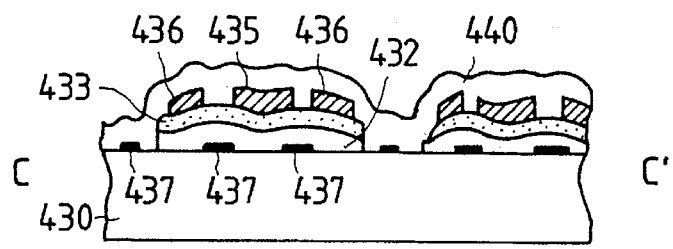

FIG. 42C is a longitudinal sectional view of the transfer switch 423a and the discharge switch 423b. The transfer switch 423a comprises an insulating layer 432 serving as a gate insulating layer, a photoconductive thin film semiconductor layer 433, an upper electrode wiring layer serving as a source electrode, and a lower electrode wiring layer 437 serving as a gate electrode.

The gate insulating layer and the photoconductive semiconductor layer of the discharge switching transistor 423b are the same as the insulating layer 432 and the photoconductive thin film semiconductor layer 433. The source electrode is constituted by the upper electrode wiring layer 435, the gate electrode is constituted by the lower electrode wiring layer 437, and the drain electrode is constituted by an upper electrode wiring layer 436. The transfer switching transistor 423a and the discharge switching transistor 423b are covered with the polyamide resin layer 440. In the same manner as described above, an ohmic contact layer is formed at interfaces between the upper electrode wiring layers 434, 435, and 436 of the photosensor unit, the transfer switching transistor, and the discharge switching transistor, and the photoconductive thin film semiconductor layer 433.

A polyimide resin or the like is used to form the protective layer 440. However, even if a hydrogenated amorphous nitride film or the like is used, composition dependency is rarely influenced.

In this embodiment, a p-type layer is formed between the source and drain electrodes 435 and 434, as described with reference to the fifth embodiment, to deplete the surface of the photoconductive semiconductor layer 433. At the same time, dependency of temperature characteristics of the photocurrent on the voltage of the gate electrode 431, as described in the fifth embodiment, is utilized, so that the operating point is corrected so as to cause the temperature characteristics to fall within the range of 60 to 70%. Even if the switching transistors T401 to T409, ST401 to ST409 are formed under the same conditions, no practical problem is posed.

Figure 43:
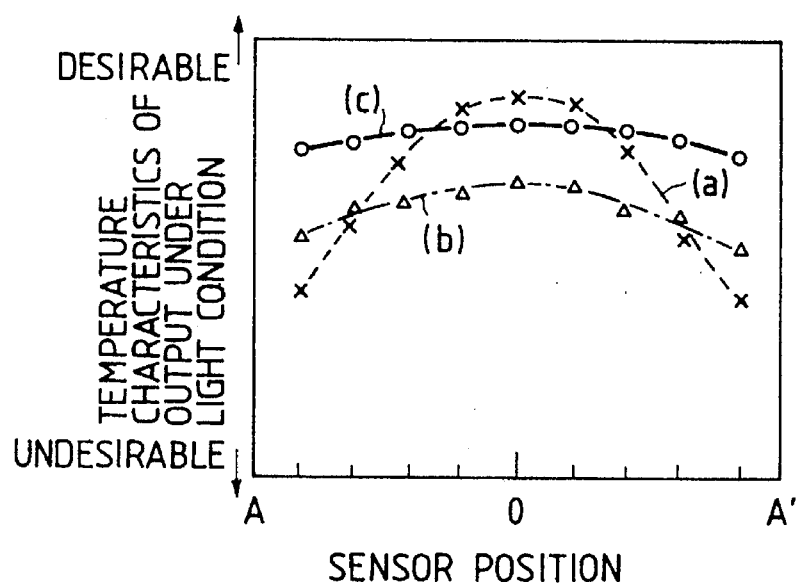
FIG. 43 shows a photocurrent temperature characteristic distribution in a one-dimensional perfect contact sensor as the photoelectric transducer apparatus along the line A—A' according to the present invention (broken curve (a)), a photocurrent temperature characteristic distribution of the conventional photosensor (dotted curve (b)), and a photocurrent temperature characteristic distribution of the photosensor of the present invention upon its correction by a gate voltage (solid curve (c)).

FIG. 43 is a graph showing the distribution of temperature characteristics of the photocurrent of the one-dimensional contact sensor serving as a photoelectric transducer apparatus of this embodiment on the line A—A' (broken curve (a)), that of the conventional photosensor (dotted curve (b)), and that corrected by the gate electrode in the photosensor of this embodiment (solid curve (c)).

The distribution of the temperature characteristics of the photocurrent of the photosensor of this embodiment is better than that of the conventional sensor, but the temperature characteristics of the photosensor of this embodiment are worse than those of the conventional photosensor. When the temperature characteristics of the photosensor of this embodiment are corrected by the gate voltage, the temperature characteristics are improved and are kept uniform.

The one-dimensional contact sensor array of this embodiment can be used as a lensless perfect contact of light from a light source 13 to the lower surface of the sensor after an anti-wear layer 11 is formed on the upper surface of the photosensor, as shown in FIG. 19. The one-dimensional contact sensor array can also be used as a contact sensor array using a one-to-one size focusing lens (SELFOC lens available from Nippon Sheet Glass Co., Ltd.) 12 shown in FIG. 20.

As has been described above, according to the present invention, since a p-type layer is formed on the surface of the upper portion of the channel region of the thin film transistor type photosensor, an almost uniform depletion state of the surface layer can be obtained. The humidity resistance and the temperature characteristic values of the photocurrent can be increased. In addition, by adjusting the gate voltages of the photosensors with respect to the distribution of the electrical characteristics of the photosensors within the substrate, especially, the dark currents and photocurrents, and their temperature characteristics, the distribution of the temperature characteristics of the photocurrent can be greatly improved.

According to the present invention, an impurity is doped in the protective layer of the thin film semiconductor of the thin film transistor type photosensor to obtain a p-type protective layer, and the operating point of the thin film transistor type photosensor is corrected by the gate voltage. Therefore, a change in surface band of the thin film semiconductor generated during the fabrication process for the thin film transistor type photosensor, e.g., upon doping of a p-type impurity, can be prevented, and the distribution and magnitude of electrical characteristics (especially, dark currents, photocurrents, and their temperature characteristics) of the thin film transistor produced upon RIE or the like can be greatly improved.

Problems posed by the fabrication process on a large substrate, and problems associated with reliability can be solved. In addition, the influences of protective film formation for improving the humidity resistance and the composition of the protective film can be reduced. As a result, a degree of freedom in selection of the protective film can be improved.

What is claimed is:

1. A photoelectric conversion device comprising:

a support;

a gate electrode provided on said support;

a thin film semiconductor layer provided through a gate insulating layer on said gate electrode;

an ohmic layer in contact with said thin film semiconductor layer provided with a gap therein;

source and drain electrodes provided in contact with said ohmic layer; and an insulating protective layer provided at least corresponding to the gap on said thin film semiconductor layer, wherein said thin film semiconductor layer at the gap is a light-receiving region, and said protective layer includes an impurity identical to one capable of controlling a conductivity of said thin film semiconductor layer for forming an energy band profile so as to collect a major carrier in said thin film semiconductor layer in an inner direction.

2. A device according to claim 1, further comprising a means for controlling a voltage of said gate electrode to compensate thermal characteristics of a photocurrent.

3. A thin film semiconductor apparatus comprising:

a plurality of photoelectric conversion devices each comprising:

a support;

a gate electrode provided on said support;

a thin film semiconductor layer provided on said gate electrode sandwiching an insulating layer therebetween;

first and second ohmic layers separated from each other to form a gap in contact with said thin film semiconductor layer;

source and drain electrodes in contact with said first and second ohmic layers, respectively;

an insulating protective layer on said thin film semiconductor layer corresponding to the gap, and wherein said insulating protective layer includes an impurity identical to one capable of controlling a conductivity type of said thin film semiconductor layer into p-type conductivity for forming an energy band profile so as to collect a major carrier in said semiconductor layer in an inner direction;

a bit or block including said photoelectric conversion devices as a constructional element; and means for applying a voltage for maintaining a gate voltage so as to compensate an output characteristic of photocurrent outputted from said photoelectric conversion device for each said bit or block.

4. A device according to claim 1, wherein said impurity is a material identical to one capable of controlling a conductivity type of said thin film semiconductor layer into p-type conductivity.

5. A device according to claim 1, wherein said protective layer includes a p-type impurity.

6. A thin film semiconductor device comprising:

a support;

a gate electrode provided on said support;

a gate insulating layer on said gate electrode;

a thin film semiconductor layer provided through said gate insulating layer on said gate electrode;

first and second ohmic layers separated from each other and in contact with said thin film semiconductor to form a gap therebetween;

source and drain electrodes provided in contact with said first and second ohmic layers, respectively; and an insulating protective layer provided on said thin film semiconductor layer at the gap, wherein said protective layer includes an impurity identical to one capable of controlling a conductivity of said thin film semiconductor layer for forming an energy band profile so as to collect a major carrier in said thin film semiconductor layer in an inner direction.

7. A photoelectric transducer apparatus comprising:

a support;

a gate electrode provided on said support;

a gate insulating layer on said gate electrode;

a thin film semiconductor layer provided through said gate insulating layer on said gate electrode;

an ohmic layer in contact with said semiconductor layer with a gap therein;

source and drain electrodes in contact with said ohmic layer;

an insulating protective layer on said thin film semiconductor layer at said gap, said gap having a photoreceiving region;

wherein the insulating protective layer contacting said thin film semiconductor layer within said photoreceiving region includes an impurity identical to one capable of controlling a conductivity of said thin film semiconductor layer into a p-type conductivity for forming an energy band profile so as to collect a major carrier in said thin film semiconductor layer in an inner direction; and means for applying a voltage to said gate electrode for improving and making uniform output characteristics of a photocurrent outputted from said photoelectric transducer apparatus.

8. A thin film semiconductor device comprising:

a support;

a gate electrode provided on said support;

a thin film semiconductor layer provided on said gate electrode sandwiching a gate insulating layer therebetween;

an ohmic layer in contact with said thin film semiconductor layer;

source and drain electrodes in contact with said ohmic layer;

an insulating protective layer on said thin film semiconductor layer at a section between said source and drain electrodes, wherein said protective layer at said semiconductor layer includes an impurity identical to one capable of controlling a conductivity of said thin film semiconductor layer into a p-type conductivity; and means for applying a voltage for controlling a voltage applied to said gate electrode.

9. A device according to claim 1, wherein said protective layer includes nitrogen and silicon atoms.

10. A device according to claim 6, wherein said protective layer includes nitrogen and silicon atoms.

11. A photoelectric conversion device comprising:

a support;

a gate electrode provided on said support;

a single or substantially single amorphous silicon thin film semiconductor layer provided through an insulating gate layer on said gate electrode;

an ohmic layer in contact with said thin film semiconductor layer; and source and drain electrodes in contact with said ohmic layer;

wherein said thin film semiconductor layer has a photoreceiving channel region between said source and drain electrodes, and at least a surface side of said thin film semiconductor layer at the photoreceiving region is depleted with regard to an electron; and means for applying a voltage to said gate electrode of said photoelectric conversion device.

12. A thin film semiconductor device comprising a thin film transistor type photoelectric conversion device and a thin film transistor on a support, wherein said thin film transistor type photoelectric conversion device comprises;

a gate electrode provided on said support;

a gate insulating layer provided on said gate electrode;

a thin film semiconductor layer provided through said gate insulating layer on said gate electrode;

an ohmic layer provided in contact with said thin film semiconductor layer with a gap therein;

source and drain electrodes provided in contact with said ohmic layer; and an insulating protective layer provided on said thin film semiconductor layer at the gap;

wherein said protective layer includes an impurity identical to one capable of controlling a conductivity type of said thin film semiconductor layer for forming an energy band profile so as to collect a major carrier in said thin film semiconductor layer in an inner direction.

13. A device according to claim 12, wherein said thin film semiconductor device further comprises means for supplying voltage to be applied to said gate of said photoelectric conversion device.

14. A device according to claim 12, wherein said thin film semiconductor device further comprises means for supplying voltage to be applied to a gate electrode of said thin film transistor.

15. A device according to claim 12, wherein said protective layer includes a silicon atom and a nitrogen atom.

16. A device according to claim 12, wherein said impurity is an element identical to one capable of controlling a conductivity of said thin film semiconductor into p-type conductivity.

17. A device according to claim 16, wherein said element is selected from elements in group III of the Periodic Table.

18. A device according to claim 17, wherein said element is boron.

19. A device according to claim 12, wherein said thin film semiconductor layer is amorphous silicon.

20. A device according to claim 12, wherein said thin film semiconductor device further comprises a capacitor.

21. A device according to claim 12, wherein a plurality of said photoelectric conversion devices are at least provided.

22. A device according to claim 12, wherein a plurality of said thin film transistors are at least provided.

23. A device according to claim 12, wherein said thin film transistor is a switching means for transferring a signal of said photoelectric conversion device.

24. A device according to claim 12, wherein
said thin film semiconductor device has a capacitor, and said thin film transistor is a switching means for refreshment of said capacitor.

25. A photoelectric conversion device comprising:

a support;

a gate electrode provided on said support;

a thin film semiconductor layer provided on said gate electrode sandwiching a gate insulating layer therebetween;

an ohmic layer with a gap provided therein in contact with said thin film semiconductor layer;

source and drain electrodes provided in contact with said ohmic layer; and an insulating protective layer provided correspondingly, at least, to the gap on said thin film semiconductor layer, wherein in order to form an energy profile for collecting a majority carrier in said semiconductor layer in an inner direction, said insulating protective layer includes an impurity capable of controlling a conductivity of said thin film semiconductor layer.

* * * * *

UNITED STATES PATENT AND TRADEMARK OFFICE
CERTIFICATE OF CORRECTION

PATENT NO. : 5,576,555

DATED : November 19, 1997

INVENTOR(S) : MASATO YAMANOBE ET AL.  Page 1 of 2

It is certified that error appears in the above-identified patent and that said Letters Patent is hereby corrected as shown below:

TITLE PAGE:

[63] RELATED U.S. APPLICATION DATA

Line 1, "July 27, 1993," should read --July 26, 1993,--.

[56] REFERENCES CITED

Foreign Patent Documents, "01137674 8/1989 Japan." should read --01-137674 8/1989 Japan.--

COLUMN 3

Line 50, "is" should be deleted.
Line 53, "As result," should read --As a result,--.

COLUMN 5

Line 7, "FIGS. 9" should read --FIG. 9--.

COLUMN 7

Line 17, "an" should read --a--.

COLUMN 11

Line 65, "at high" should read --at a high--.

COLUMN 16

Line 19, "at high" should read --at a high--.

UNITED STATES PATENT AND TRADEMARK OFFICE
CERTIFICATE OF CORRECTION

PATENT NO. : 5,576,555

DATED : November 19, 1997

INVENTOR(S) : MASATO YAMANOBE ET AL.

It is certified that error appears in the above-identified patent and that said Letters Patent is hereby corrected as shown below:

COLUMN 19

Line 36, "dare" should read --dark--.

COLUMN 20

Line 1, "37B." should read --37B,--.

COLUMN 23

Line 56, "(especially," should read --(especially--.

Signed and Sealed this

Thirteenth Day of May, 1997

Attest:

BRUCE LEHMAN

Attesting Officer　　　　Commissioner of Patents and Trademarks